United States Patent [19]

Morikawa et al.

[11] Patent Number: 5,644,416
[45] Date of Patent: Jul. 1, 1997

[54] LIGHT MODULATION DEVICE AND METHOD OF LIGHT MODULATION USING THE SAME

[75] Inventors: Takashi Morikawa; Ryojiro Akashi, both of Minami Ashigara, Japan

[73] Assignee: Fuji Xerox Co., Ltd., Tokyo, Japan

[21] Appl. No.: 981,866

[22] Filed: Nov. 25, 1992

[30] Foreign Application Priority Data

| Nov. 26, 1991 | [JP] | Japan | 3-335448 |
| Jun. 12, 1992 | [JP] | Japan | 4-177775 |
| Aug. 6, 1992 | [JP] | Japan | 4-229387 |

[51] Int. Cl.$^6$ ............................ G02F 1/13
[52] U.S. Cl. ...................... 349/86; 395/96
[58] Field of Search .............. 359/96, 98, 103, 359/104, 105; 430/345, 338; 428/1

[56] References Cited

U.S. PATENT DOCUMENTS

| 4,963,448 | 10/1990 | Ichimura et al. | 430/20 |
| 5,013,474 | 5/1991 | Arai et al. | 359/45 |
| 5,023,859 | 6/1991 | Eich et al. | 365/113 |
| 5,024,784 | 6/1991 | Eich et al. | 252/299.01 |
| 5,049,428 | 9/1991 | Kanno et al. | 428/64 |
| 5,073,294 | 12/1991 | Shannon et al. | 359/96 |
| 5,088,086 | 2/1992 | Van et al. | 369/100 |
| 5,118,586 | 6/1992 | Hattori et al. | 430/20 |
| 5,155,607 | 10/1992 | Inoue et al. | 359/96 |
| 5,234,799 | 8/1993 | Nagae et al. | 359/103 |
| 5,262,890 | 11/1993 | Berkovic et al. | 359/328 |
| 5,359,085 | 10/1994 | Iwamoto et al. | 548/468 |

FOREIGN PATENT DOCUMENTS

| 1009282 | 1/1989 | Japan . |
| 1-246538 | 10/1989 | Japan . |
| 1-251344 | 10/1989 | Japan . |
| 2-190827 | 7/1990 | Japan . |

OTHER PUBLICATIONS

Synthesis and mesomorphic behavior of poly(methylsiloxane)s and poly(methylsiloxane-co-dimethylsiloxane(s) containing oligooxyethylene spacers and mesogenic side groups, Percec et al., Polymer Bulletin 23, 463–470 (1990).

Phase behaviour of liquid–crystalline copoly(dimethyl-m-ethylhydrogeno)siloxanes substituted with long polar side groups, Tinh et al., Liquid Crystals, 1990, vol. 7, No. 3, 385–394.

Yitzchaik et al "Photochromism of Liquid Crystal Polyacrylates Containing Spiropyran Groups", Macromolecules, 1990, 23, 707–713.

"Photoinduced Reorientation and Optical Anisotropy in Films of Photochromic Liquid Crystalline Polymers by Angular Dependent Photoselection", Stumpe et al, Freiburg Liquid Crystal Conference, Mar. 1991.

Shragina et al, "Searching for Photochromic Liquid Crystals Spironaphthoxazine Substituted with a Mesogenic Group", Liquid Crystals, 1990, vol. 7 #5 pp. 643–655.

"Photo and Thermochromic Liquid Crystal Polysiloxanes**", Cabrera et al, Angew Chem. Int. Ed., 1987, 11, pp. 1178–1180.

(List continued on next page.)

Primary Examiner—William L. Sikes
Assistant Examiner—James A. Dudek
Attorney, Agent, or Firm—Oliff & Berridge

[57] ABSTRACT

A light modulation device with high density, high sensitivity, and excellent stability while having a simple construction and a non-destructive memory reading method using the same are disclosed. The light modulation device comprises a high polymeric liquid crystal film comprising a uniaxially orientated side chain type high polymeric liquid crystal containing a photochromic compound, and it modulates light in the wavelength region in which the photochromic compound has no absorption by making use of a change in refractive index anisotropy of the high polymeric liquid crystal film which has been caused by photoisomerization of the photochromic compound. The device is useful as a stable and high-density optical computing device or an erasable optical memory material.

11 Claims, 7 Drawing Sheets

OTHER PUBLICATIONS

Yitzchaik et al "Photochromism of Side Chain Liquid Crystal Polymers Containing Spironaphthoxazines", Liquid Crystals, 1990 vol. 8 #5 pp. 677–686.

Eckhardt et al, "Formation of Molecular H and J Stacks by Spiropyran–merocyanine Transformation in a Polymer Matrix", Polymer 1987 Oct., vol. 28 1959–1964.

Abstract of the 17th Liquid Crystal Lecture Meeting, pp. 246–247 3F307.

The 58th Spring Anniversary of Japan Chemical Society (1989) 3IH30.

The 52th Spring Anniversary of Japan Chemical Society (1986) 3U02.

Mol. Cryst. Liq. Cryst., 1989, vol. 169, pp. 167–192.

Makromol. Chem. 179, pp. 273–276 (1978).

Eur. Polym. J. vol. 18, pp. 651–659 (1982).

The Chemical Socitey of Japan, Chemistry Letters, pp. 911–914 (1987).

Langmuir 1988, 4, pp. 1214–1216.

Polymer Bulletin 17, pp. 285–291 (1987).

1990 American Chemical Society, Macromolecules, vol. 23, No. 1 (1990).

Makromol. Chem., Rapid Commun. 8, pp. 59–63 (1987).

Photo–and Thermochromic Liquid Crystal Polysiloxanes, Cabrera et al., Angew. Chem. Int. Ed. Engl. 26 (1987) No. 11, pp. 1178–1180.

Thermally Irreversible Photochromic Liquid Crystal Polymers, Cabrera et al., Angew Chem. Int. Ed. Engl. 30 (1991) No. 1, pp. 76–78.

Photo–and Thermo–chromic Liquid Crystal Polymers with Spiropyran Groups, Cabrera et al., Mol. Cryst. Liq. Cryst., 1988, vol. 155, pp. 221–230.

WAVELENGTH

LIGHT MODULATION DEVICE AND METHOD OF LIGHT MODULATION USING THE SAME

FIELD OF THE INVENTION

This invention relates to a novel light modulation device and a method of light modulation using the same. More particularly, it relates to a stable and high-density light modulation device which uses a photochromic compound and is useful as an optical computing device, an optical shutter, and an erasable optical memory material and to a method of reading an optical memory using the device.

BACKGROUND OF THE INVENTION

Known light modulation devices include those utilizing an electro-optical effect, a magneto-optical effect, an acoustic optical effect, etc.

Light modulation devices utilizing an electro-optical effect use a change in refractive index on electrical field application, and those utilizing a magneto-optical effect use rotation of the plane of polarization on magnetic field application. Those utilizing an acoustic optical effect use a phenomenon that, for example, when a radiofrequency voltage is applied to a transducer composed of comb type electrodes formed on a waveguide to produce a surface acoustic wave according to the frequency of the input signals, the angle of polarization of the guided light changes by the interaction between the guided light and the surface acoustic wave.

Since the conventional light modulation devices thus achieve light modulation by application of an electrical or magnetic field, there is a limit in possibility of increasing precision and speed. Hence, devices enabling light modulation by using light are expected to be very useful.

Light modulation devices using light which have been proposed to date include (1) devices comprising a combination of a photoconductive element and a liquid crystal element, (2) devices using a mixture of a ferroelectric liquid crystal and a photochromic compound (see *The Abstract of the 17th Liquid Crystal Lecture Meeting*, p. 246), and (3) devices in which a photochromic compound is orientated to have a transition moment in a given direction and a change in birefringence of the photochromic compound accompanied by photoisomerization is utilized (JP-A-2-190827, the term "JP-A" as used herein means an "unexamined published Japanese patent application").

With reference to use of a light modulation device as an optical memory, it has hitherto been proposed to use a photochromic compound to provide an erasable optical memory. However, reading of the memory according to the conventional technique requires exposure to light of the wavelength region in which the photochromic compound used shows absorption. Since the light for reading also serves as light for erasure of the memory, there has been involved a great problem for practical use that exposure to such light results in destruction of the memory.

To avoid this, it has been suggested to use light of the longer wavelength region in which a photochromic compound used shows no absorption to induce a change of the photochromic compound other than a change in absorbance, such as a change in optical rotation (see JP-A-1-246538) or refractive index anisotropy (see *The 58th Spring Anniversary of Japan Chemical Society, The Abstract of Lecture Meeting* (1989), 31H30).

Attempts have also been made to use a mixture of a photochromic compound and a liquid crystal material to bring about a greater change. For example, a method in which a liquid crystal material is mixed with a chiral photochromic compound, and a cholesteric liquid crystal phase is changed by photoisomerization of the photochromic compound (see *The 52th Spring Anniversary of Japan Chemical Society, The Abstract of Lecture Meeting* (1986)) and a method in which a liquid crystal material is mixed with a compound which undergoes a great structural change through a photochromic reaction, and a change in circular dichroism spectrum is caused by photoisomerization have been proposed.

Further, for the purpose of preventing deterioration with time caused by fluidity of a liquid crystal, a method of using a high polymeric liquid crystal and a method in which an orientation state of a liquid crystal is changed by photoisomerization of a photochromic compound immobilized on a substrate (see JP-A-1-251344).

The above-described light modulation devices (1) and (2) essentially utilize an electro-optical effect and give rise to a problem of electrical power consumption. In the case of the devices (1), a complicated step is required for laminating a photoconductive element and a liquid crystal element. In the case of the devices (2), although the structure is simple, the modulation mode achieved is only binary because the bistability of a ferroelectric liquid crystal is used, and the working temperature range is narrow. In the case of the devices (3), the change in birefringence accompanied by photoisomerization is too small for obtaining a sufficient contrast.

Where the light modulation devices so far proposed are applied to optical memories, none of them is satisfactory due to various disadvantages involved on practical use. For example, the methods of reading any change other than a change in absorption of a photochromic compound are hardly put to practical use because the change in optical properties attained is small. The methods of using a photochromic compound in combination with a liquid crystal material have a disadvantage in that the liquid crystal flows with time to make the memory unclear and also the memory has poor thermal stability and poor durability on repeated use. The system utilizing a phase transition of a high polymeric liquid crystal encounters difficulty in completely erasing the memory. Thus, the conventional memory materials using a photochromic compound have various problems and have not yet been put to practical use.

SUMMARY OF THE INVENTION

An object of the present invention is to provide a light-light modulation device with high density, high sensitivity, and excellent stability while having a simple construction.

Another object of the present invention is to provide an light modulation device useful as an optical memory material which can be read in a non-destructive manner and is excellent in durability and stability.

A further object of the present invention is to provide a method for reading memory put in an light modulation device without destrucing the memory.

As a result of extensive investigations, the inventors have found that light modulation can be achieved by utilizing the phenomenon that a high polymeric liquid crystal film comprising a uniaxially orientated side chain type high polymeric liquid crystal containing a photochromic compound undergoes a change in refractive index anisotropy induced by a photochromic reaction of the photochromic compound and thereby modulates light in the wavelength region in which the photochromic compound has no absorption. They have also found that the above phenomenon can be made use of for reading memory with light of specific wavelength, thereby making it possible to non-destructively and repeatedly write and reproduce memory. The present invention has been completed based on these findings.

The present invention relates to a light modulation device composed of a high polymeric liquid crystal film comprising a uniaxially orientated side chain type high polymeric liquid crystal containing a photochromic compound and a supporting member for supporting said high polymeric liquid crystal film.

The light modulation device of the present invention is characterized by a high polymeric liquid crystal film comprising a uniaxially orientated side chain type high polymeric liquid crystal containing a photochromic component. The light modulation device modulates light in the wavelength region in which the photochromic compound has no absorption by utilizing a change in refractive index anisotropy of the high polymeric liquid crystal film induced by photoisomerization of the photochromic compound.

The light modulation device according to the present invention includes (A) a device comprising a high polymeric liquid crystal film in which a side chain type high polymeric liquid crystal having a photochromic component covalently bonded thereto is uniaxially orientated (hereinafter referred to as embodiment (A)) and (B) a device comprising a high polymeric liquid crystal film in which a side chain type high polymeric liquid crystal having a photochromic compound dispersed therein is uniaxially orientated (hereinafter referred to as embodiment (B)).

The method for reading an optical memory comprises photoisomerizing the photochromic component in embodiment (A) or the photochromic compound in embodiment (B) to induce a change in refractive index anisotropy of the high polymeric liquid crystal film and detecting the change with light in the wavelength region in which the photochromic compound has no absorption.

DETAILED DESCRIPTION OF THE INVENTION

Figure 1:
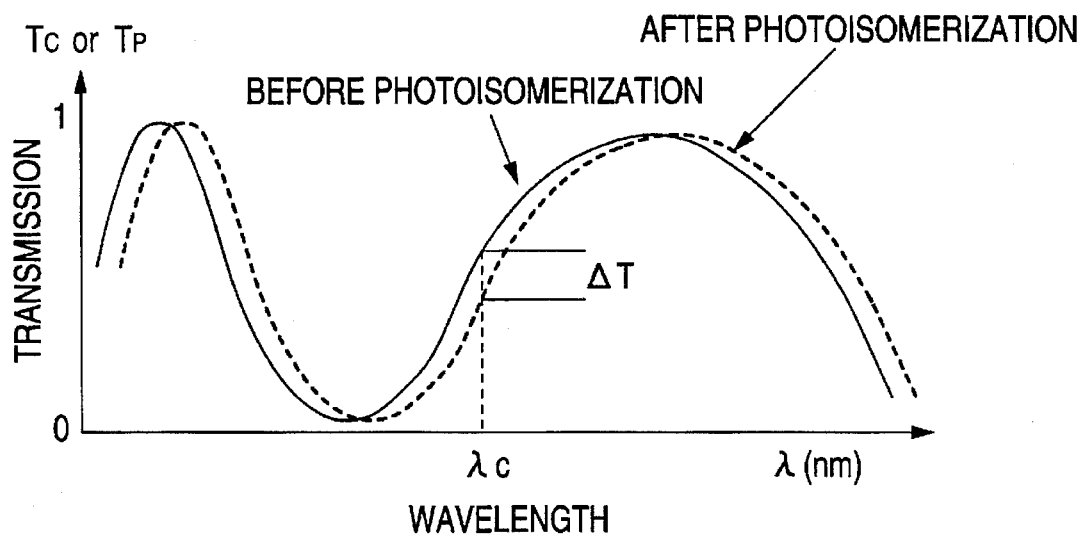
FIG. 1 is a graph depicting the principle of the reading method according to the present invention.

The optical modulating material which can be used in the light modulation device according to the present invention comprises at least a side chain type high polymeric liquid crystal and a photochromic compound as essential components. In embodiment (A), the photochromic compound is covalently bonded to the side chain of the side chain type high polymeric liquid crystal. In embodiment (B), the photochromic compound is dispersed in the side chain type high polymeric liquid crystal.

The terminology "side chain type high polymeric liquid crystal" as used herein means a high polymer pendent with mesogen molecules exhibiting liquid crystal properties at the side chain thereof via an alkyl spacer of prescribed length. Similarly to low-molecular weight liquid crystals, the side chain type high polymeric liquid crystal assumes various liquid crystal phases, such as a nematic phase, a smectic phase, or a cholesteric phase. The structure of the liquid crystal of this type is disclosed, e.g., in *Mol. Cryst. Liq. Crystal.*, Vol. 167, p. 169 (1989).

The side chain type liquid crystal with a photochromic component covalently bonded thereto according to embodiment (A) includes (a) a copolymer comprising an addition-polymerizable liquid crystal monomer and a photochromic monomer and (b) a polymer obtained by addition reaction of a liquid crystal compound having an unsaturated double bond (hereinafter referred to as a reactive liquid crystal compound) and a photochromic compound having an unsaturated double bond (hereinafter referred to as a reactive photochromic compound) to a reactive polymer, such as reactive silicone.

The addition-polymerizable liquid crystal monomer in polymer (a) is composed of a liquid crystal molecule (such as a biphenyl compound, a phenyl benzoate compound, a cyclohexylbenzene compound, an azoxybenzene compound, an azomethine compound, a phenylpyrimidine compound, a biphenyl benzoate compound, a cyclohexylbiphenyl compound, and a terphenyl compound) to which an acrylic ester or a methacrylic ester is bonded via an appropriate alkyl spacer. While not limiting, such addition-polymerizable liquid crystal monomers are typically represented by formula (I):

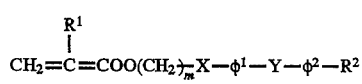

wherein $R^1$ represents a hydrogen atom or a methyl group; X and Y each represent a single bond, —O—, —COO—, —OCO—, —CH=N—, or —N=CH—; $R^2$ represents an alkyl group preferably having up to 30 carbon atoms, an alkoxy group preferably having up to 30 carbon atoms, a carboxyl group, a fluoroalkyl group preferably having up to 30 carbon atoms, a fluoroalkoxy group preferably having up to 30 carbon atoms, a cyano group, a halogen atom, a hydroxyl group, or a hydrogen atom; and $\phi^1$ and $\phi^2$ each represent a group selected from the following groups (preferably those marked with *):

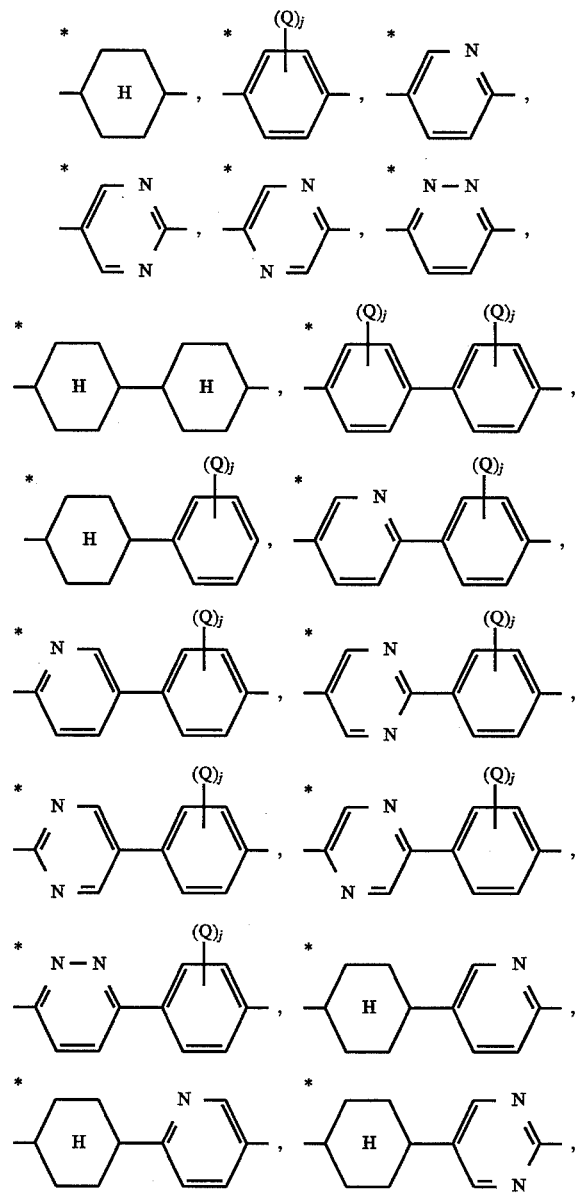

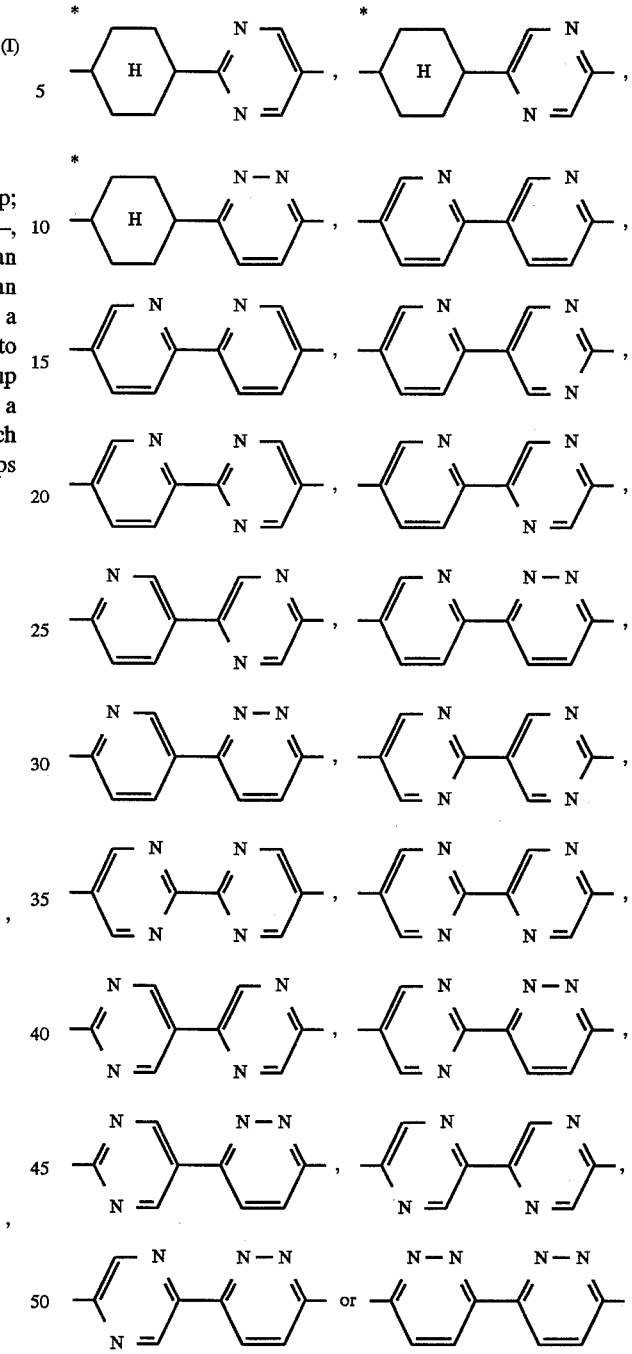

wherein Q represents a hydrogen atom, a fluorine atom, a chlorine atom, or a bromine atom; and j represents 0 or an integer of from 1 to 4.

The copolymerizable photochromic monomer in polymer (a) includes those composed of a spiropyran derivative, a spiro-oxazine derivative, a fulgide derivative, or a diarylethene derivative to which an acrylic ester, a methacrylic ester, etc. is bonded. While not limiting, such a photochromic monomer includes those represented by formulae (II) to (VII):

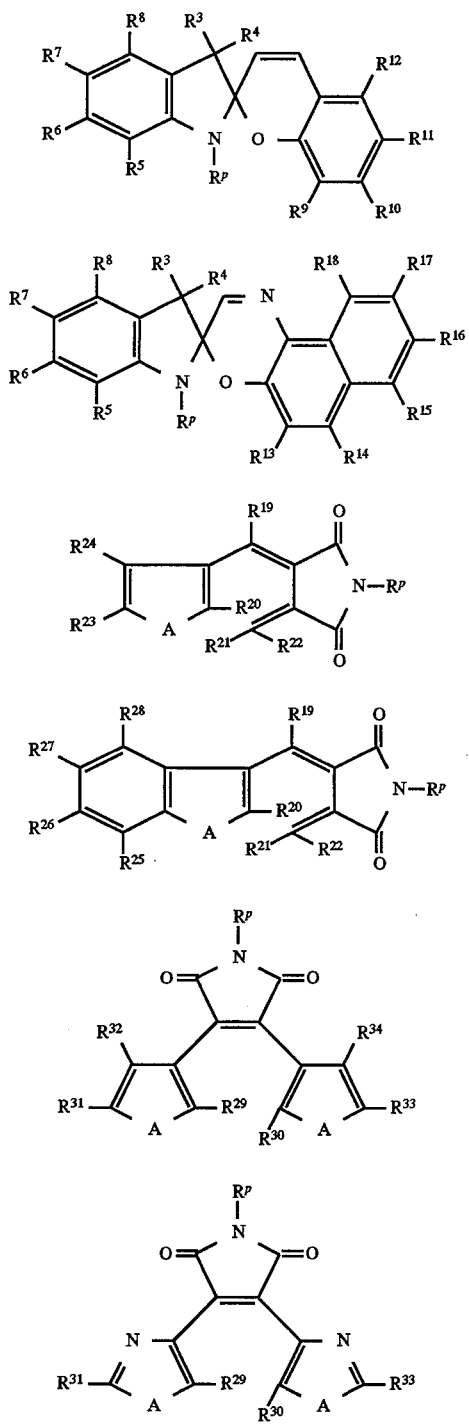

(II)

(III)

(IV)

(V)

(VI)

(VII)

wherein $R^p$ represents a group of formula:

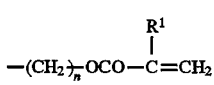

(wherein $R^1$ represents a hydrogen atom or a methyl group; and n represents 0 or an integer of from 1 to 30) or a group of formula:

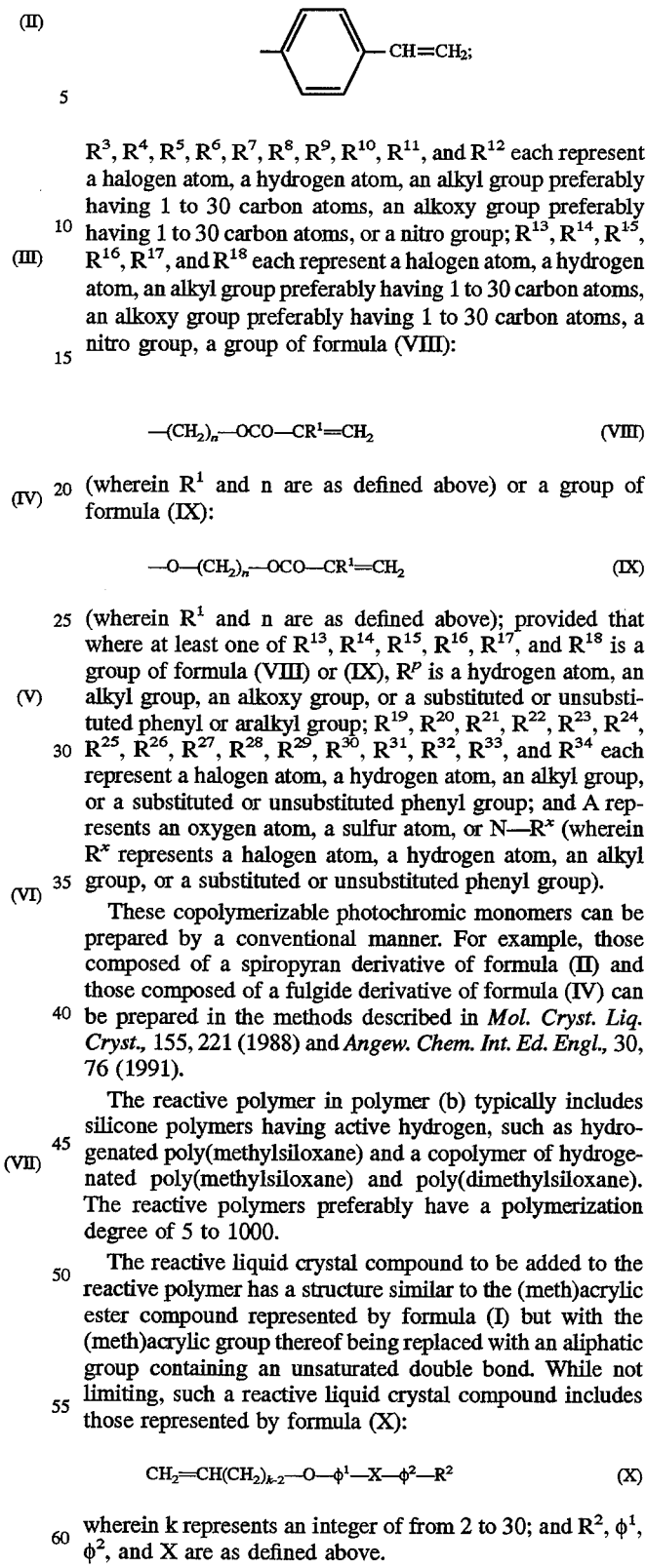

$R^3$, $R^4$, $R^5$, $R^6$, $R^7$, $R^8$, $R^9$, $R^{10}$, $R^{11}$, and $R^{12}$ each represent a halogen atom, a hydrogen atom, an alkyl group preferably having 1 to 30 carbon atoms, an alkoxy group preferably having 1 to 30 carbon atoms, or a nitro group; $R^{13}$, $R^{14}$, $R^{15}$, $R^{16}$, $R^{17}$, and $R^{18}$ each represent a halogen atom, a hydrogen atom, an alkyl group preferably having 1 to 30 carbon atoms, an alkoxy group preferably having 1 to 30 carbon atoms, a nitro group, a group of formula (VIII):

$$—(CH_2)_n—OCO—CR^1=CH_2 \qquad (VIII)$$

(wherein $R^1$ and n are as defined above) or a group of formula (IX):

$$—O—(CH_2)_n—OCO—CR^1=CH_2 \qquad (IX)$$

(wherein $R^1$ and n are as defined above); provided that where at least one of $R^{13}$, $R^{14}$, $R^{15}$, $R^{16}$, $R^{17}$, and $R^{18}$ is a group of formula (VIII) or (IX), $R^p$ is a hydrogen atom, an alkyl group, an alkoxy group, or a substituted or unsubstituted phenyl or aralkyl group; $R^{19}$, $R^{20}$, $R^{21}$, $R^{22}$, $R^{23}$, $R^{24}$, $R^{25}$, $R^{26}$, $R^{27}$, $R^{28}$, $R^{29}$, $R^{30}$, $R^{31}$, $R^{32}$, $R^{33}$, and $R^{34}$ each represent a halogen atom, a hydrogen atom, an alkyl group, or a substituted or unsubstituted phenyl group; and A represents an oxygen atom, a sulfur atom, or N—$R^x$ (wherein $R^x$ represents a halogen atom, a hydrogen atom, an alkyl group, or a substituted or unsubstituted phenyl group).

These copolymerizable photochromic monomers can be prepared by a conventional manner. For example, those composed of a spiropyran derivative of formula (II) and those composed of a fulgide derivative of formula (IV) can be prepared in the methods described in *Mol. Cryst. Liq. Cryst.*, 155, 221 (1988) and *Angew. Chem. Int. Ed. Engl.*, 30, 76 (1991).

The reactive polymer in polymer (b) typically includes silicone polymers having active hydrogen, such as hydrogenated poly(methylsiloxane) and a copolymer of hydrogenated poly(methylsiloxane) and poly(dimethylsiloxane). The reactive polymers preferably have a polymerization degree of 5 to 1000.

The reactive liquid crystal compound to be added to the reactive polymer has a structure similar to the (meth)acrylic ester compound represented by formula (I) but with the (meth)acrylic group thereof being replaced with an aliphatic group containing an unsaturated double bond. While not limiting, such a reactive liquid crystal compound includes those represented by formula (X):

$$CH_2=CH(CH_2)_{k-2}—O—\phi^1—X—\phi^2—R^2 \qquad (X)$$

wherein k represents an integer of from 2 to 30; and $R^2$, $\phi^1$, $\phi^2$, and X are as defined above.

The reactive liquid crystal compound can be prepared in a conventional manner as described in *Liquid Crystals*, Vol. 7. No. 3, 385 (1990) and *Polymer Bulletin*, 23, 463 (1990).

The reactive photochromic compound to be added to the reactive polymer includes those represented by formulae (XI) to (XVI):

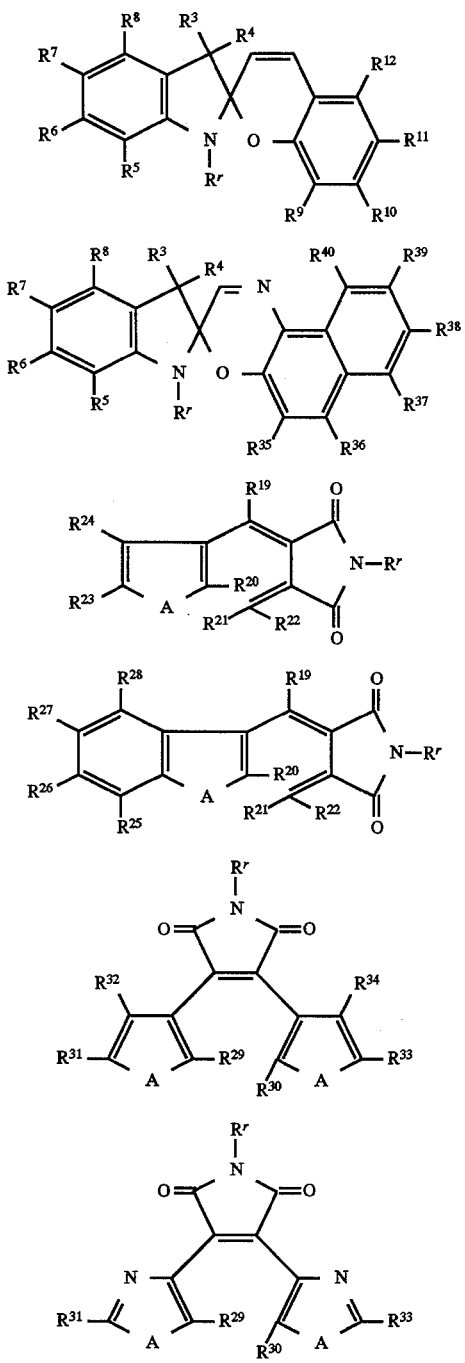

wherein $R^r$ represents —$(CH_2)_{k-2}CH=CH_2$; $R^{35}$, $R^{36}$, $R^{37}$, $R^{38}$, $R^{39}$, and $R^{40}$ each represent a halogen atom, a hydrogen atom, an alkyl group preferably having 1 to 30 carbon atoms, an alkoxy group preferably having 1 to 30 carbon atoms, a nitro group, or —$(CH_2)_{k-2}CH=CH_2$; provided that where at least one of $R^{35}$, $R^{36}$, $R^{37}$, $R^{38}$, $R^{39}$, and $R^{40}$ is —$(CH_2)_{k-2}CH=CH_2$, $R^r$ is a hydrogen atom, an alkyl group preferably having 1 to 30 carbon atoms, an alkoxy group preferably having 1 to 30 carbon atoms, or a substituted or unsubstituted phenyl or aralkyl group; and $R^3$, $R^4$, $R^5$, $R^6$, $R^7$, $R^8$, $R^9$, $R^{10}$, $R^{11}$, $R^{12}$, $R^{19}$, $R^{20}$, $R^{21}$, $R^{22}$, $R^{23}$, $R^{24}$, $R^{25}$, $R^{26}$, $R^{27}$, $R^{28}$, $R^{29}$, $R^{30}$, $R^{31}$, $R^{32}$, $R^{33}$, $R^{34}$, A, and k are as defined above.

The reactive photochromic compound can also be prepared in a known method as described in, for example, Angew. Chem. Int. Ed. Engl., 26, 1178 (1978).

In embodiment (A), introduction of a photochromic component into a side chain type high polymeric liquid crystal can be effected through various processes, for example, a method comprising copolymerizing the above-mentioned liquid crystal monomer and photochromic monomer by general radical polymerization or ion polymerization, or a method comprising adding to a reactive polymer (e.g., hydrogenated poly(methylsiloxane)) the above-mentioned reactive liquid crystal compound and reactive photochromic compound in the presence of a platinum catalyst, e.g., hexachloroplatinic acid hexahydrate. In this regard, reference can be made to Angew. Chem. Int. Ed. Engl., 30, 76 (1991), ditto 26, 1178 (1987), and Mol. Cryst. Liq. Cryst., 155, 221 (1988).

The photochromic component is preferably introduced in an amount of from 0.1 to 50% by weight, particularly from 1 to 20% by weight, in terms of a monomer unit based on the total amount of the monomer components (including the photochromic component) constituting the final side chain type high polymeric liquid crystal. If the proportion of the photochromic component is less than 0.1% by weight, a desired change in physical properties may not be obtained by photoisomerization. If it exceeds 50% by weight, the liquid crystal properties are considerably reduced, making it difficult to prepare a cell for use as an optical memory material.

The above-described high polymeric liquid crystal usually has a weight average molecular weight of from 1,000 to 1,000,000, and preferably from 1,000 to 50,000. High polymeric liquid crystals having a glass transition temperature (Tg) of not higher than 50° C. are preferred for their high efficiency of modulation.

The structure of the side chain type high polymeric liquid crystal which can be used in embodiment (B) is disclosed, e.g., Mol. Cryst. Liq. Crystal, Vol. 167, p. 169 (1989). For example, the structure includes those having positive dielectric anisotropy (e.g., cyanobiphenyl, cyanophenyl benzoate, cyanobiphenyl benzoate, or cyanophenyl 4-phenylbenzoate) or negative dielectric anisotropy (e.g., methoxybiphenyl, methoxyphenyl benzoate, methoxybiphenyl benzoate, or methoxyphenyl 4-phenylbenzoate) whose main chain has a polyacrylate, polymethacrylate, polyether, polyester, or polysiloxane structure. Specific but non-limiting examples of such side chain type high polymeric liquid crystals are those comprising a repeating unit represented by formulae (XVII) to (XX) shown below. With respect to the molecular weight and glass transition temperature of these liquid crystals, the description given to those used in embodiment (A) applies to embodiment (B).

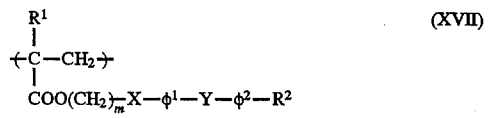

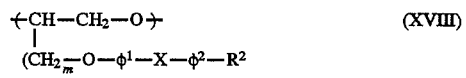

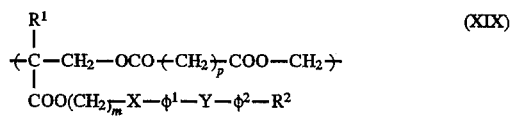

-continued

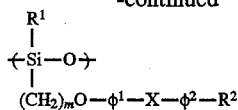
(XX)

wherein p represents an integer of from 1 to 20; and $R^1$, $R^2$, X, Y, m, $\phi^1$, and $\phi^2$ are as defined above.

The photochromic compound to be dispersed in the above-mentioned side chain type high polymeric liquid crystal includes various compounds described in G. H. Brown, *Photochromism*, such as spiropyran derivatives, spiro-oxazine derivatives, azobenzene derivatives, fulgide derivatives, diarylethene derivatives, triarylmethane derivatives, and indigo derivatives. In particular, fulgide derivatives and diarylethene derivatives, which are photon mode photochromic compounds undergoing no thermal isomerization, are preferred for use as an optical memory material from the standpoint of memory stability.

Examples of suitable fulgide derivatives and diarylethene derivatives are those represented by formulae (XXI) to (XXVI):

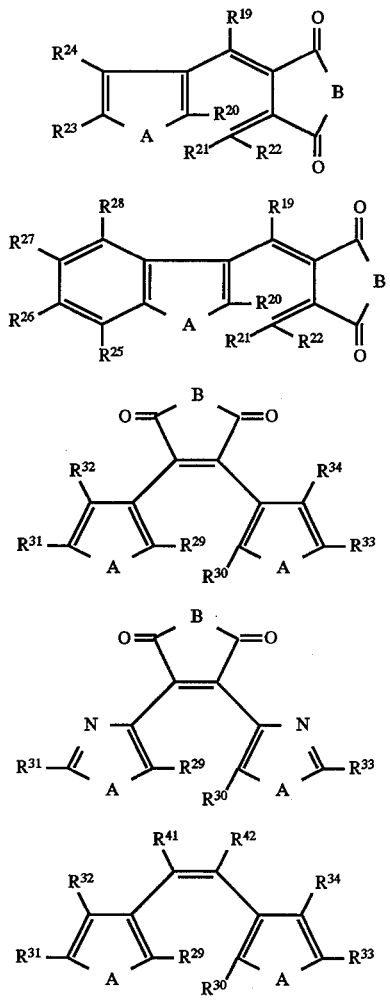

-continued

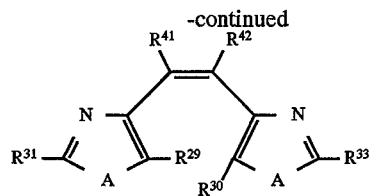
(XXVI)

wherein B represents an oxygen atom or N—$R^x$; $R^{41}$ and $R^{42}$ each represent a halogen atom, a hydrogen atom, an alkyl group preferably having 1 to 30 carbon atoms, or a substituted or unsubstituted phenyl group which may be substituted with a halogen atom, a nitro group, an alkyl group having 1 to 30 carbon atoms, an alkoxy group having 1 to 30 carbon atoms, and the like, and A, $R^{19}$, $R^{20}$, $R^{21}$, $R^{22}$, $R^{23}$, $R^{24}$, $R^{25}$, $R^{26}$, $R^{27}$, $R^{28}$, $R^{29}$, $R^{30}$, $R^{31}$, $R^{32}$, $R^{33}$, $R^{34}$, and $R^x$ are as defined above.

Among these photochromic compounds, fulgide derivatives represented by formula (XXVII) or (XXVIII) are preferred:

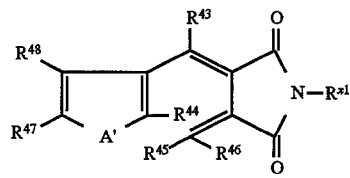
(XXVII)

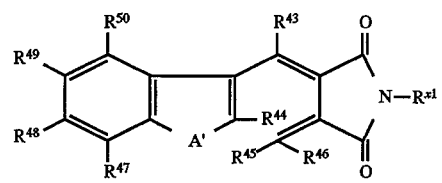
(XXVIII)

wherein $R^{43}$, $R^{44}$, $R^{45}$, $R^{46}$, $R^{47}$, $R^{48}$, $R^{49}$, and $R^{50}$, which may be the same or different, each represent a hydrogen atom, a halogen atom, or an alkyl group having from 1 to 10 carbon atoms; A' represents an oxygen atom, a sulfur atom, or —$NR^{x2}$ (wherein $R^{x2}$ represents a hydrogen atom, an alkyl group having from 1 to 10 carbon atoms, or a substituted or unsubstituted phenyl group); and $R^{x1}$ represents an alkyl group having from 2 to 30 carbon atoms, or a group of formula (XXIX) or (XXX):

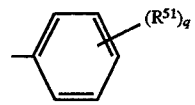
(XXIX)

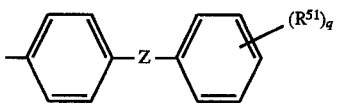
(XXX)

wherein Z represents a single bond, —O—, —COO—, —OCO—, —CH$_2$O—, —N=N—, —CH=N—, or —N=CH—; $R^{51}$ represents an alkyl group having from 1 to 30 carbon atoms, an alkoxy group, a halogen atom, or a cyano group; and q represents an integer of from 1 to 5.

The compounds of formula (XXVII) or (XXVIII) have high compatibility with the above-described side chain type high polymeric liquid crystal and excellent chemical and thermal stability to provide an light modulation device with high sensitivity. When applied to an optical memory, they are excellent in non-destructive reading performance, recording sensitivity, and durability. Particularly preferred are the fulgide compounds of formula (XXVII) wherein A' is an oxygen atom; $R^{43}$, $R^{44}$, $R^{45}$, $R^{46}$, and $R^{47}$ is each a hydrogen atom; $R^{x1}$ is a phenyl group of formula (XXIX); and $R^{51}$ is a $C_{2-18}$ alkyl or $C_{1-10}$ alkoxy group bonded to the p-position.

The absorption wavelength of the compound of formula (XXVII) per se becomes longer according as A' in (XXVII) changes from oxygen to sulfur, and from sulfur to nitrogen. However, if the absorption wavelength becomes too longer, it would overlap the wavelength resulting from the change due to birefringence characteristic of the present invention, leading to restriction of the wavelength of light for reading in, for example, the visible region. The absorption wavelength of the compound of formula (XXVIII) is longer than that of the compound of formula (XXVII) by a wavelength corresponding to one benzene ring as far as the substituents being similar. The change in absorption wavelength of the compound of formula (XXVIII) depending on the substituent A' is the same as in the case of the formula (XXVII).

The amount of the photochromic compound to be dispersed in the side chain type high polymeric liquid crystal is subject to variation depending on the desired physical properties but preferably ranges from 0.1 to 50% by weight, and more preferably from 1 to 20% by weight. If the proportion of the photochromic compound is less than 0.1% by weight, it is not easy to obtain a sufficient change in physical properties on photoisomerization. If it exceeds 50% by weight, the liquid crystal properties are reduced, making it difficult to prepare a cell for use as, for example, an optical memory material.

Liquid crystal phases are roughly divided into a nematic phase, a smectic phase, and a cholesteric phase. Liquid crystals used in general liquid crystal displays are those taking a nematic phase. Since the same liquid crystal usually assumes a plurality of liquid crystal phases with a temperature change, it is necessary to define a liquid crystal phase in a temperature range of use. A nematic phase is characterized in that liquid crystal molecules are orientated in order with respect to a single direction and therefore exhibit a relatively low viscosity with which a high rate of response to an electrical field can be achieved. On the other hand, a smectic phase is characterized in that the liquid crystal molecules are orientated in order not only in the vertical direction but in the crosswise direction to form an LB film-like layer structure. That is, in a smectic phase, since the liquid crystal molecules are three-dimensionally packed with no gaps and tend to have an increased viscosity, the smectic phase shows no substantial response to an electrical field or requires considerably high power for making a response. A cholesteric phase is composed of liquid crystal molecular layers each of which shows a nematic phase, the direction of orientation gradually changing among layers to form a helix. The cholesteric phase selectively reflects light having a specific wavelength depending on the pitch of the helix. The side chain type high polymeric liquid crystals which can be used in the present invention are preferably those exhibiting a nematic phase in a temperature range of use. This is because a smectic phase has a higher viscosity and poor compatibility with a photochromic compound and because a cholesteric phase fails to achieve uniaxial orientation which is an essential requirement for accomplishing the object of the present invention. A high polymeric liquid crystal which per se exhibits a smectic phase or a cholesteric phase but, when combined with a photochromic compound, provides a composition showing a nematic phase as a whole can also be used.

The light modulation device of the present invention basically comprises a uniaxially orientated high polymeric liquid crystal film comprising a side chain type high polymeric liquid crystal to which a photochromic component is covalently bonded (embodiment (A)) or a side chain type high polymeric liquid crystal having dispersed therein a photochromic compound (embodiment (B)). If desired, the high polymeric liquid crystal film may further contain various weather stabilizers, such as an antioxidant (e.g., hindered amine or hindered phenol), for the purpose of improving durability and the like. The weather stabilizers are preferably added in an amount of from 0.01 to 5% by weight based on the side chain type high polymeric liquid crystal having a covalently bonded photochromic component (embodiment (A)) or the total of the side chain type high polymeric liquid crystal and the photochromic compound (embodiment (B)).

The high polymeric liquid crystal film may furthermore contain a low-molecular liquid crystal material for the purpose of increasing the change in physical properties on photoisomerization thereby to increase the rate of response or to broaden the range of working temperature. Addition of the low-molecular liquid crystal material brings about a reduction in viscosity or an improvement in change in refractive index anisotropy. As low-molecular liquid crystal materials there may be used compounds having a skeleton of biphenyl, phenyl benzoate, terphenyl, phenylcyclohexane, phenylpyrimidine or biphenylcyclohexane, and having thereon a long-chain alkyl or alkoxy group and a polar group (e.g., a cyano group, an alkoxy group, a halogen atom) or an alkyl group. The amount of the low-molecular liquid crystal material to be added ranges preferably from 1 to 80% by weight, more preferably from 10 to 50% by weight, and most preferably from 10 to 40% by weight, based on the side chain type high polymeric liquid crystal having a covalently bonded photochromic compound or the total of the side chain type high polymeric liquid crystal and the photochromic compound. Addition of a lower level produces no substantial effect, and addition of a higher level results in a failure of film formation.

Orientation of the high polymeric liquid crystal material according to embodiment either (A) or (B) can be carried out in the same manner as in orientation of low-molecular liquid crystal materials. That is, a thin orientation film generally having a thickness of 1 to 10 nm and made of polyvinyl alcohol (PVA), polyimide, polyamide, etc. or a coated layer of a silan coupling agent is provided on a substrate, followed by rubbing it in one direction with cloth, paper, cotton, etc. Two of the thus-treated substrates are piled with a spacer such that the rubbing directions of the two substrates are the same, and the space therebetween is filled with a liquid crystal material. In this case, orientation of the side chain type high polymeric liquid crystal can be achieved effectively by subjecting the liquid crystal material to annealing in a temperature range within which the side chain type high polymeric liquid crystal assumes a liquid crystal phase or by once heating the filled liquid crystal material to its melting point or softening point followed by gradual cooling. Other than the above-described orientation films, layers formed by vapor deposition or sputtering of metal compounds (e.g., alkyl metal compounds) or organic compounds may be used for the purpose. A stretched polymer film may also be used as an orientation film, and in this case the rubbing treatment can be omitted. Orientation may also be effected without using the above-mentioned orientation film by a method peculiar to high polymeric liquid crystals, i.e., by applying an outer stress such as stretching to the high polymeric liquid crystal film.

The light modulation device according to the present invention preferably has a structure composed of a pair of substrates between which a high polymeric liquid crystal film of embodiment (A) or (B) is supported. An orientation film may be provided between the substrate and the high polymeric liquid crystal film, and a light reflecting layer may be provided on one of the substrates. Further, a reflection preventive layer for prevention of reflection on the outermost layer or an interference layer for improving the efficiency of incident laser light may be provided.

The high polymeric liquid crystal film has a thickness preferably of from 0.1 to 100 μm, more preferably of from 0.1 to 50 μm, and most preferably of from 1 to 20 μm. Where an orientation film is provided, it preferably has a thickness of from 0.001 to 10 μm.

Suitable substrates include sheets of glass, polycarbonate, polymethyl methacrylate, or an olefin resin. Where the light modulation device is of transmission type which can be read by light transmission, transparent substrates are preferred.

Figure 2:
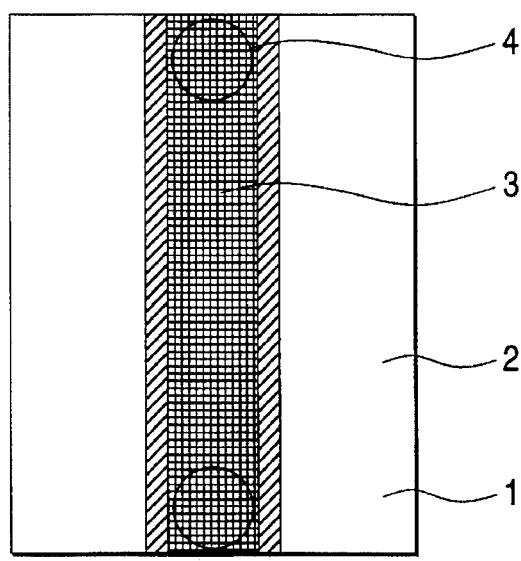
FIG. 2 is a schematic cross section of the light modulation device prepared in Example 1.

FIG. 2 shows a typical example of the light modulation device according to the present invention, in which numerals 1 through 4 indicate a transparent substrate, a PVA orientation film, a uniaxially orientated high polymeric liquid crystal film, and a spacer, respectively.

A typical example of the light modulation device of the present invention and a process for preparing it are explained below.

A solution containing materials for an orientation film is coated on each of two substrates by spin coating, bar coating, doctor blade coating, or the like technique and dried to form an orientation film. The orientation film is rubbed unidirectionally with cloth or paper. Raw materials for the above-described high polymeric liquid crystal film are dissolved in an appropriate solvent or heat-melted and coated on the orientation film to form a high polymeric liquid crystal layer having a prescribed thickness. Another substrate on which an orientation film has been formed is then superposed on the high polymeric liquid crystal layer and contact bonded under reduced pressure or bonded by heat to prepare a cell. It is recommended to use a spacer, such as glass beads or fine particles or a film of a synthetic resin, for cell thickness precision. Finally, the cell is then subjected to annealing at a prescribed temperature or once heated followed by gradual cooling to cause the liquid crystal molecules to be uniaxially orientated. The cell in which the high polymeric liquid crystal molecules are uniaxially orientated is transparent but shows birefringence. When observed with a polarizing microscope, a dark field and a light field appear in turns under crossed Nicols for every 45° of an angle of rotation, thereby lending confirmation to the orientation.

Light modulation by use of the light modulation device according to the present invention will be explained below taking the structure of the photochromic component or compound before or after undergoing a photoisomeric change as structure A or structure B, respectively. Light having a wavelength $\lambda_A$ that structure A absorbs is used for inducing photoisomerization (a change to structure B), and light having a wavelength $\lambda_B$ that structure B absorbs is used for a change to structure A. The light modulation device modulates linear polarized light having a wavelength $\lambda_C$ that neither structure A nor B absorbs. That is, the intensity of the linear polarized light is modulated while passing through the cell or, after having being reflected on the cell, passing through an analyzer. The light modulation in the former case (transmission type) will be taken for an instance in the following description. Light modulation can be carried out by putting the light modulation device in between a pair of polarizing sheets with their planes of polarization either crossed or parallel. Satisfactory light modulation can be achieved by setting the cell in such a manner that the direction of orientation of the high polymeric liquid crystal and the plane of polarization of the polarizer form an angle ranging from 30° to 60°, and particularly 45°. Where polarized laser light is used as incident light to be modulated, only an analyzer is sufficient. In this case, too, satisfactory modulation can be achieved by setting the cell in such a manner that the direction of orientation of the high polymeric liquid crystal and the plane of polarization of the laser light form an angle ranging from 30° to 60°, and particularly 45°. In the case where the light modulation device is of reflection type, light modulation can be carried out in the same manner as in the case of the transmission type device, except for placing both a polarizer and an analyzer on one side of the cell with their plane of polarization crossed or parallel.

The light modulation device according to the present invention can be used as an optical memory material. Writing and reading of memory will be explained taking the structure of the photochromic component or compound having no memory and that having memory as structure A and B, respectively.

Writing can be carried out by application of light having a wavelength $\lambda_A$ structure A absorbs, upon which structure A changes into structure B to achieve memorization. Reading of the memory can be carried out by using linear polarized light having a wavelength $\lambda_C$ neither structure A nor B absorbs. The linear polarized light is transmitted by the cell or reflected and then passes through an analyzer where the difference in light intensity is read out. Erasion of the memory can be carried out by irradiating light having a wavelength $\lambda_B$ structure B absorbs to thereby cause structure B to change into structure A.

The method of non-destructive reading according to the present invention will be explained below. In the case of a transmission type light modulation device, the information (spot) recorded in the optical memory material can be read by placing the cell between a pair of polarizing sheets (one is a polarizer, and the other is an analyzer) with their planes of polarization either crossed (crossed Nicols) or parallel (parallel Nicols). In this case, satisfactory reading can be conducted by setting the cell in such a manner that the direction of orientation of the high polymeric liquid crystal film forms an angle of from 30° to 60°, and preferably 45°, with the plane of polarization of the polarizer.

Where polarized laser light is used as a light source of reading light, only an analyzer is sufficient. In this case, too, satisfactory reading can be achieved by setting the cell in such a manner that the direction of orientation of the high polymeric liquid crystal film and the plane of polarization of the laser light form an angle ranging from 30° to 60°, and particularly 45°.

In the case where the light modulation device is of reflection type, reading can be carried out in the same manner as in the case of the transmission type device, except for placing both a polarizer and an analyzer on one side of the cell with their planes of polarization crossed or parallel.

While the principle of the light modulation according to the present invention is not necessarily clear, the following assumption could be made with reference to FIG. 1. In FIG. 1, the solid line shows wavelength dependence of percent transmission Tc (where two polarizing sheets form crossed Nicols) or Tp (where two polarizing sheets form parallel Nicols) before photoisomerization, and the dotted line shows that after photoisomerization.

When linear polarized light $\lambda$ enters a birefringent medium having refractive index anisotropy ($\Delta n$), the incident light is transmitted with its direction of polarization forming a helix due to the optical path difference between ordinary rays and extraordinary rays. Where the polarization direction of the incident light and the direction of the refractive index anisotropy Δn form an angle of 45°, the ordinary rays and the extraordinary rays have the same intensity. Assuming that the medium with refractive index anisotropy Δn has a thickness d, with the polarization direction of the polarizing sheet on the incident light side (polarizer) and the direction of Δn forming an angle of 45°, Δnd corresponds to an optical path difference. Taking the intensity of the light transmitted by the first polarizing sheet as 1, transmission Tc (where the two polarizing sheets form crossed Nicols) is given by formula (1):

$$Tc = \sin^2(\pi \Delta nd/\lambda) \qquad (1)$$

Transmission Tp (where the two polarizing sheets form parallel Nicols) is given by formula (2):

$$Tp = \cos^2(\pi \Delta nd/\lambda) \qquad (2)$$

That is, under crossed Nicols, Tc reaches the minimum where $\Delta nd/\lambda = 0, 1, 2 \ldots$, and becomes the maximum where $\Delta nd/\lambda = 1/2, 3/2 \ldots$. Under parallel Nicols, on the other hand, Tp reaches the minimum where $\Delta nd/\lambda = 1/2, 3/2 \ldots$, and becomes the maximum where $\Delta nd/\lambda = 0, 1, 2 \ldots$. Accordingly, by choosing an appropriate optical path difference Δnd, the transmission of light to be modulated can be set at the maximum or the minimum in the initialized state. In the case where the light modulation device comprises a uniaxially orientated side chain type high polymeric liquid crystal containing at least one thermally stable photochromic component or compound, the photochromic component or compound in the area having received light $\lambda_A$ undergoes a photoisomeric change, and the high polymeric liquid crystal thereby undergoes a change in orientation state to change Δn. As a result, the wavelength at the maximum or minimum transmission is shifted (see FIG. 1). Therefore, with the film thickness d being so set as to have the minimum transmission in the initial state, the transmission of the area irradiated with light $\lambda_A$ increases to modulate the transmission of light $\lambda_C$, thereby making it possible to obtain half tone display. The medium can be initialized by irradiation of light $\lambda_B$. While the above explanation has been directed to the case where the initial state has a maximum or minimum transmission, the initial state is not limited thereto as long as any change of transmitted light can be obtained by photoisomerization.

Where the light modulation device of the present invention is used as an optical memory, the transmission in the initialized state (before recording) at the wavelength at which reading of memory is to be effected can be set at the maximum or minimum by a proper choice of an optical path difference Δnd. In the case where the optical memory material comprises a uniaxially orientated side chain type high polymeric liquid crystal containing at least one thermally stable photochromic component or compound, the liquid crystal changes its orientation state by photoisomerization of the photochromic component or compound upon memory writing. As a result, Δn of the memory material changes, leading to a shift of the wavelength at the maximum or minimum transmission (see FIG. 1). Therefore, with the film thickness d being so set as to have the minimum transmission in the initial state, the transmission of the area with memory increases thereby enabling reading of the memory as a change in transmission. This change in transmission can be produced reversibly by photoisomerization of the photochromic component or compound.

The present invention is now illustrated in greater detail with reference to Examples, but it should be understood that the present invention is not limited thereto. All the percents are by weight unless otherwise indicated.

EXAMPLE 1

A polymer comprising a monomer unit represented by formula (A) shown below was used as a side chain type high polymeric liquid crystal. The polymer had a weight average molecular weight of about 30,000 and showed a liquid crystal phase at a temperature ranging from 35° to 122° C.

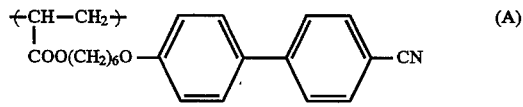

A 8% PVA aqueous solution was coated on each of two glass substrates by spin coating, and the coated film was rubbed with cotton cloth. A 40% tetrahydrofuran (THF) solution of the high polymeric liquid crystal containing 5% of a furylfulgide compound represented by formula (B) shown below was coated on one of the glass substrates by bar coating. After drying the coated film, a resin spacer having a diameter of 10 μm was scattered thereon, and the other glass substrate was superposed thereon and contact bonded at a temperature elevated up to 130° C. The cell was then subjected to annealing at 100° C. for 30 minutes to cause uniaxial orientation of the high polymeric liquid crystal. The resulting cell was transparent and exhibited satisfactory orientation properties. When observed under a polarizing microscope with crossed Nicols, the cell repeatedly exhibited a dark field and a light field for every angle of rotation of 45°.

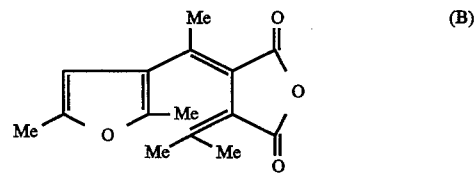

(wherein Me is a methyl group)

Figure 3:
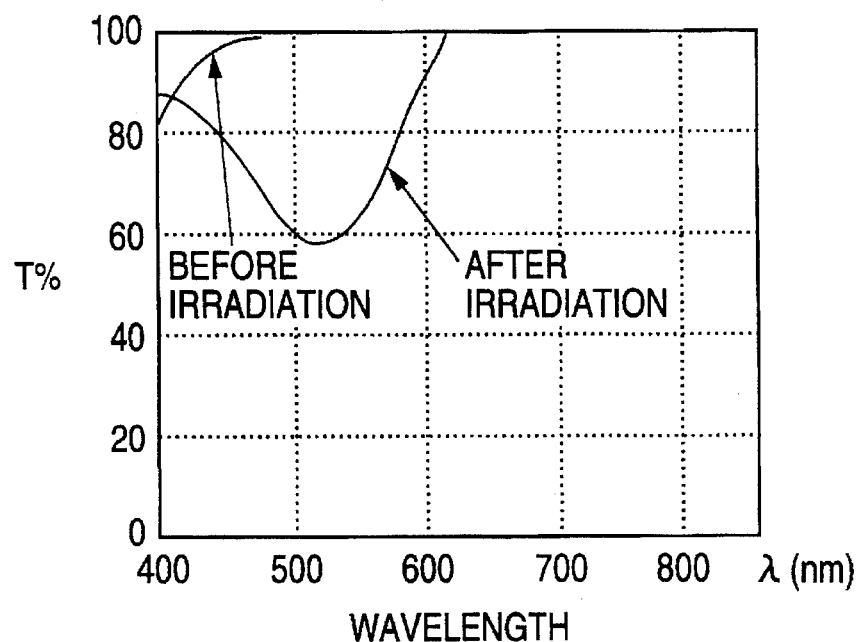
FIG. 3 is a spectrum of light transmitted by the light modulation device prepared in Example 1 before or after ultraviolet irradiation.

Memory writing was conducted with ultraviolet rays (λ=365 nm). The transmission before and after ultraviolet irradiation was measured, and the results obtained are shown in FIG. 3. After the ultraviolet irradiation, the cell showed the maximum absorption at λ=510 nm and the absorption end at 620 nm.

Memory erasure was conducted with white light. By alternating irradiation of ultraviolet light and white light, writing (coloration) and erasion could be repeated.

Figure 4:
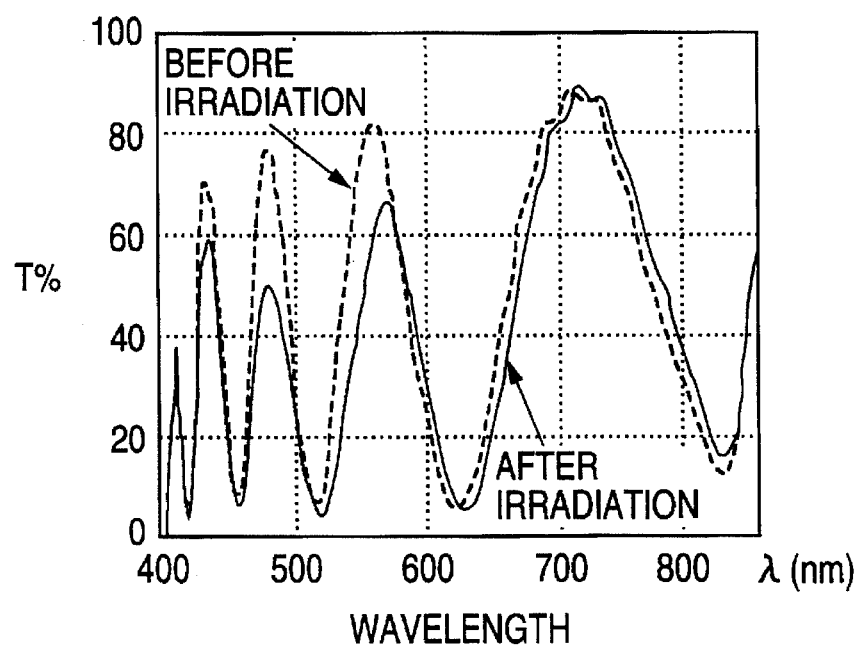
FIG. 4 is a spectrum of light transmitted by the light modulation device prepared in Example 1 under crossed Nicols, with the direction of orientation forming an angle of 45° with the plane of polarization, before or after ultraviolet irradiation.
Figure 5:
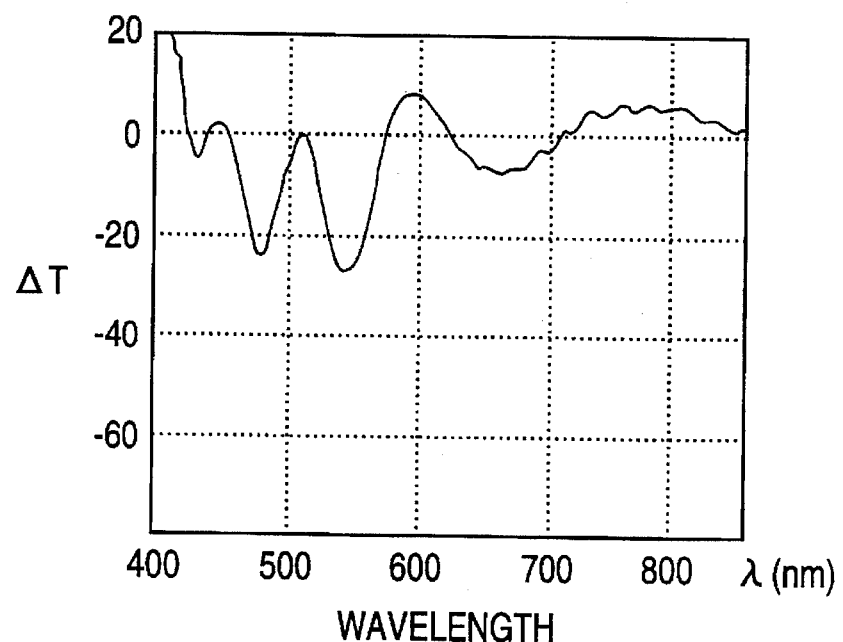
FIG. 5 is a graph showing a differential spectrum of light transmitted by the light modulation device prepared in Example 1 under crossed Nicols before and after ultraviolet irradiation.

FIG. 4 shows the transmission spectrum before and after ultraviolet irradiation (measuring temperature: 25° C.) with the cell being placed under crossed Nicols with its orientation direction and the plane of polarization forming an angle of 45°. FIG. 5 is a differential spectrum showing a difference between the spectrum before photoisomerization and that after photoisomerization. There was observed a change of about 10% in transmission in the wavelength region of from 630 nm to 830 nm which does not concern absorption of the fulgide compound. This change was reversible and was erased, not on irradiation of light for reading (λ=780 nm), but on white light irradiation.

EXAMPLE 2

In a THF solvent, 0.1 g of a polymerizable spiro-oxazine compound represented by formula (C) shown below and 1.9 g of a liquid crystal monomer represented by formula (D) shown below were copolymerized in the presence of azobisisobutyronitrile (AIBN) as an initiator. The reaction product was re-precipitated in methanol to obtain 1.8 g of a high polymeric liquid crystal as a pale red solid. The composition of the high polymeric liquid crystal was confirmed by an NMR analysis to be substantially equal to that charged.

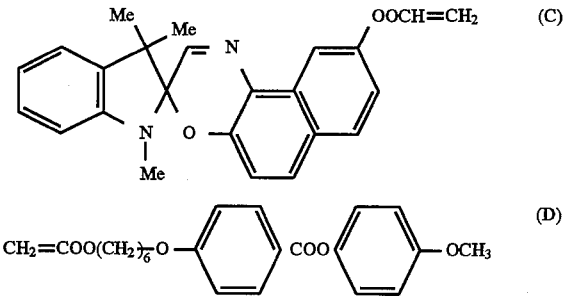

(wherein Me is a methyl group)

A liquid crystal cell was prepared by using the resulting high polymeric liquid crystal in the same manner as in Example 1. The high polymeric liquid crystal used had a weight average molecular weight of about 20,000 and exhibited a liquid crystal phase in a temperature range of from 30° to 90° C. After contact bonding, the cell was gradually cooled from 95° C. to 35° C. at a cooling rate of 1° C./min to cause uniaxial orientation.

Figure 6:
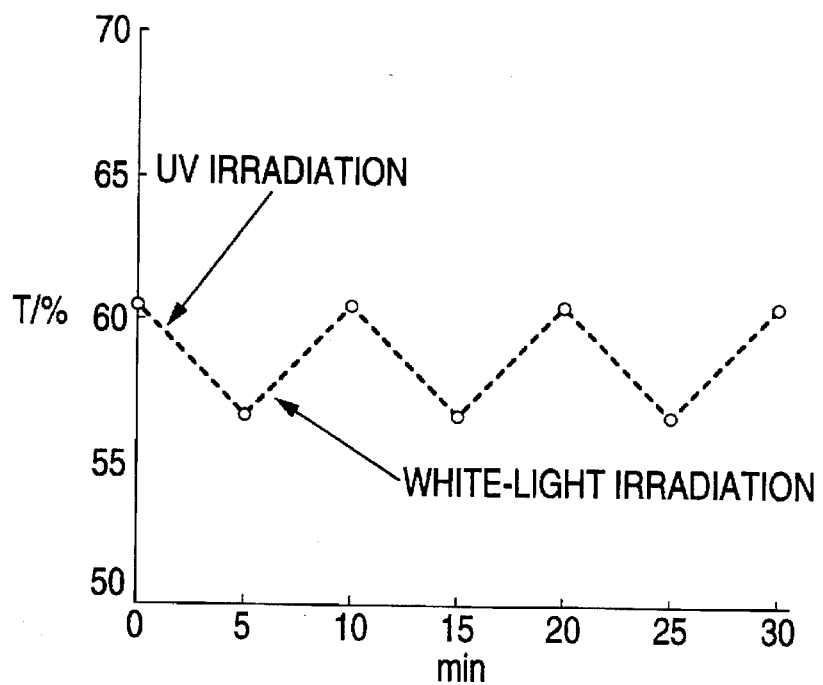
FIG. 6 is a graph showing changes of percent transmission of the light modulation device prepared in Example 2 under parallel Nicols caused by alternating recording and reading.

A change in transmission by ultraviolet irradiation was measured in the same manner as in Example 1. After the ultraviolet irradiation, the maximum absorption appeared at λ=610 nm with the absorption end at 700 nm. This change was reversible and was erasable by white light irradiation. Ultraviolet irradiation and white light irradiation were alternatingly repeated for every 5 minutes to evaluate durability. The results obtained are shown in FIG. 6 (under parallel Nicols; angle between orientation direction and plane of polarization: 45°; measuring wavelength λ: 760 nm; measuring temperature: 25° C.). It is seen from FIG. 6 that the high polymeric liquid crystal in which the spiro-oxazine component is copolymerized in part of the side chain exhibits excellent durability on repeated use, with no deterioration observed.

EXAMPLE 3

In the same manner as in Example 1, 0.1 g of a polymerizable fulgide compound represented by formula (E) shown below and 0.19 g of a liquid crystal monomer represented by formula (F) shown below were copolymerized to obtain 1.7 g of a high polymeric liquid crystal containing 5% of a unit derived from the fulgide monomer. The resulting high polymeric liquid crystal had a weight average molecular weight of about 18,000 and showed a liquid crystal phase in a temperature range of from 33° to 106° C.

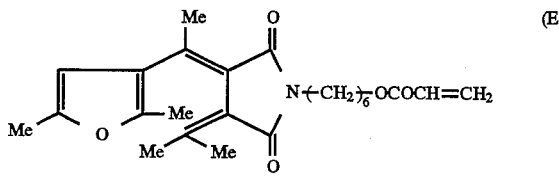

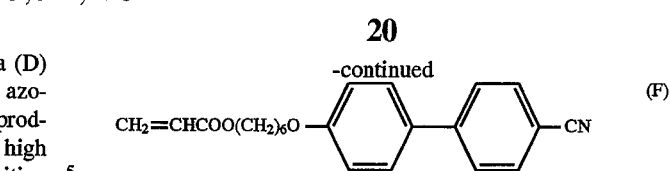

(wherein Me is a methyl group)

A liquid crystal cell was prepared by using the resulting high polymeric liquid crystal in the same manner as in Example 1. After contact bonding, the cell was subjected to annealing at 100° C. for 30 minutes to cause uniaxial orientation.

A change in transmission by ultraviolet irradiation was measured in the same manner as in Example 1 (measuring temperature: 25° C.). After the ultraviolet irradiation, the maximum absorption appeared at λ=520 nm with the absorption end at 630 nm. There was observed a change reaching about 10% at its maximum in transmission in the wavelength region of from 640 nm to 830 nm which does not concern absorption of the fulgide compound. This change was reversible and was erasable, not on irradiation of light for reading (λ=780 nm), but on white light irradiation. The response time was about 400 ms.

EXAMPLE 4

In a THF solvent, 0.1 g of a polymerizable spiro-oxazine compound represented by formula (C) shown above and 1.9 g of a liquid crystal monomer represented by formula (D) shown above were copolymerized in the presence of AIBN as an initiator. The reaction mixture was re-precipitated in methanol to obtain 1.8 g of a high polymeric liquid crystal as a pale red solid. The composition of the high polymeric liquid crystal was confirmed by an NMR analysis to be substantially equal to that charged. The resulting high polymeric liquid crystal had a weight average molecular weight of about 6,000 and exhibited a liquid crystal phase in a temperature range of from 10° to 75° C.

A 8% PVA aqueous solution was coated on each of two glass substrates by spin coating, and the coated film was rubbed with cotton cloth. A 40% THF solution of the above-prepared high polymeric liquid crystal was coated on one of the glass substrates by bar coating. After drying the coated film, a resin spacer having a diameter of 10 μm was scattered thereon, and the other glass substrate was superposed thereon and contact bonded at a temperature elevated up to 120° C. The cell was then subjected to annealing at 70° C. for 30 minutes to cause uniaxial orientation of the high polymeric liquid crystal. The structure of the resulting cell is shown in FIG. 2. The cell was transparent and exhibited satisfactory orientation properties. When observed under a polarizing microscope with crossed Nicols, the cell repeatedly exhibited a dark field and a light field for every angle of rotation of 45°.

Figure 7:
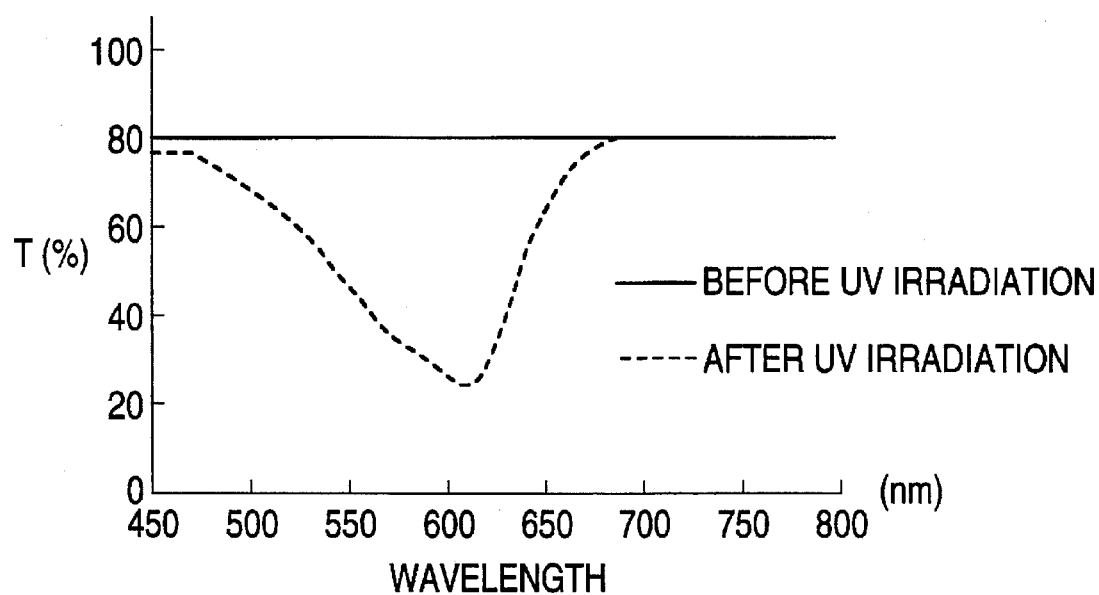
FIG. 7 is a spectrum of light transmitted by the light modulation device prepared in Example 4 before or after ultraviolet irradiation.

The cell exhibited photochromism on ultraviolet irradiation. FIG. 7 shows the transmission spectrum before and after ultraviolet irradiation. After the irradiation, the maximum absorption appeared at λ=610 nm with an absorption end at 700 nm.

Figure 8:
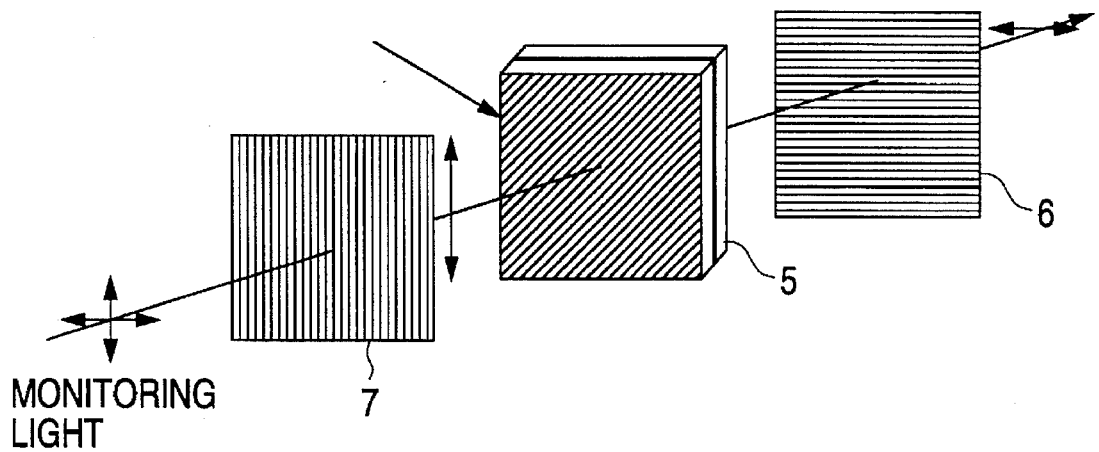
FIG. 8 is a schematic illustration of an optical system of a light modulation device.
Figure 9:
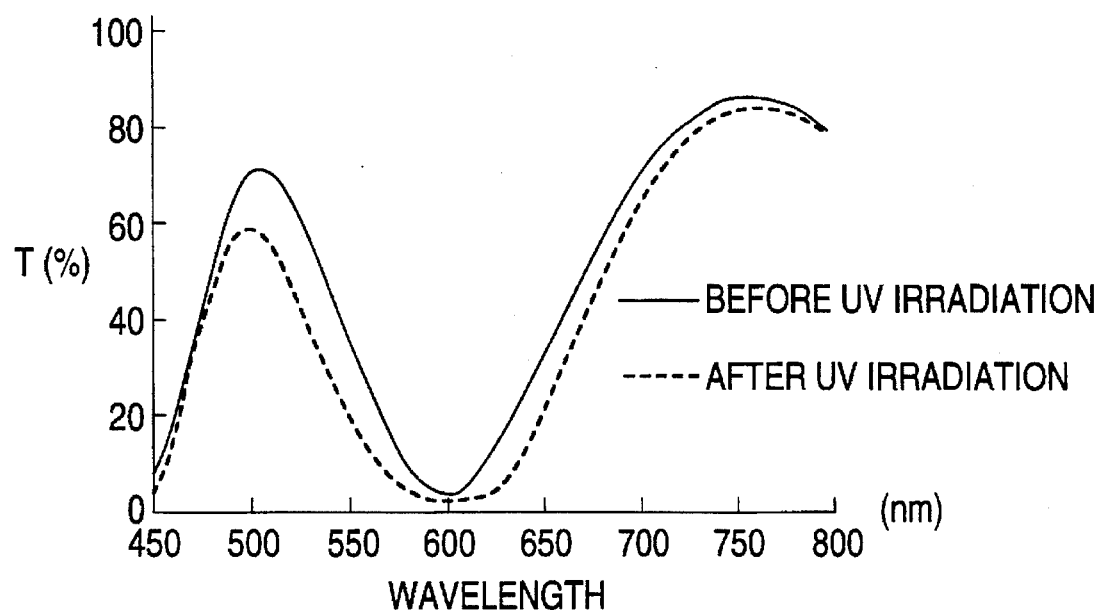
FIG. 9 is a spectrum of light transmitted by the light modulation device prepared in Example 4 under crossed Nicols, with the direction of orientation forming an angle of 45° with the plane of polarization, before or after ultraviolet irradiation.

As shown in FIG. 8, the cell was placed between a pair of polarizing sheets (crossed Nicols) with the direction of orientation forming an angle of 45° with the plane of polarization of each of polarizing sheets 6,7, and light was irradiated onto cell 5. A change in transmission spectrum by the ultraviolet irradiation was measured at 25° C. The results obtained are shown in FIG. 9. There was observed a change reaching about 6% at its maximum in transmission in the wavelength region of from 700 nm to 830 nm which does not concern absorption of the spiro-oxazine compound. This change was reversible and was erased (initialized), not on irradiation of light for reading ($\lambda_C$=780 nm), but on white light irradiation. The response time, defined as a time required for the light $\lambda_C$ to change its transmitted light intensity from 10% to 90% of the greatest change, was 300 ms at the time of erasion. The cell was also excellent in stability on repeated use.

EXAMPLE 5

A polymerizable spiro-oxazine compound of formula (C) and a liquid crystal monomer of formula (D) were copolymerized in the same manner as in Example 4, except for changing the kind of the solvent and the amount of the initiator to prepare a high polymeric liquid crystal having a weight average molecular weight of about 20,000 and exhibiting a liquid crystal phase in a temperature range of from 30° to 95° C.

A liquid crystal cell was prepared by using the resulting high polymeric liquid crystal in the same manner as in Example 4. The cell, after contact bonding, was subjected to annealing at 90° C. for 30 minutes to cause uniaxial orientation. The cell was transparent and assumed a satisfactory orientation state. When observed under a polarizing microscope with crossed Nicols, the cell repeatedly exhibited a dark field and a light field for every angle of rotation of 45°.

A change in transmission caused by ultraviolet irradiation was measured under crossed Nicols in the same manner as in Example 4. As a result, there was observed a change reaching about 3% at its maximum in transmission in the wavelength region of from 700 nm to 830 nm which does not concern absorption of the spiro-oxazine compound. The response time was 700 ms at the time of erasion.

EXAMPLE 6

A polymer comprising a monomer unit represented by formula (A), having a weight average molecular weight of about 5500, and exhibiting a liquid crystal phase in a temperature range of from 15° to 100° C. was used as a side chain type high polymeric liquid crystal. A 40% THF solution of the high polymeric liquid crystal containing 3% of a spiro-oxazine compound represented by formula (G) shown below was coated on one of two glass substrates by bar coating. After drying the coated film, a resin spacer having a diameter of 10 μm was scattered thereon, and the other glass substrate was superposed thereon, followed by contact bonding. The cell was then subjected to annealing at 90° C. for 30 minutes to cause uniaxial orientation of the high polymeric liquid crystal. The resulting cell was transparent and exhibited satisfactory orientation properties. When observed under a polarizing microscope with crossed Nicols, the cell repeatedly exhibited a dark field and a light field in turns for every angle of rotation of 45°.

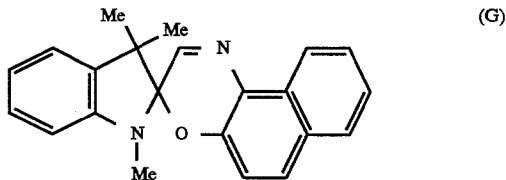

(wherein Me is a methyl group)

A change in transmission caused by ultraviolet irradiation was measured under crossed Nicols in the same manner as in Example 4. As a result, there was observed a change reaching about 7% at its maximum in transmission in the wavelength region of from 700 nm to 830 nm which does not concern absorption of the spiro-oxazine compound. This change was reversible and was erased (initialized), not on irradiation of light for reading ($\lambda_C$=780 nm), but on white light irradiation. The response time was 280 ms at the time of erasion. The cell was also excellent in stability on repeated use.

EXAMPLE 7

A polymer comprising a monomer unit represented by formula (A), having a weight average molecular weight of about 18000, and exhibiting a liquid crystal phase in a temperature range of from 35° to 122° C. was used as a side chain type high polymeric liquid crystal. A 40% THF solution of the high polymeric liquid crystal containing 3% of a spiro-oxazine compound represented by formula (G) was coated on one of two glass substrates by bar coating. After drying the coated film in the same manner as in Example 4, a resin spacer having a diameter of 10 μm was scattered thereon, and the other glass substrate was superposed thereon, followed by contact bonding. The cell was then subjected to annealing at 90° C. for 30 minutes to cause uniaxial orientation of the high polymeric liquid crystal. The resulting cell was transparent and exhibited satisfactory orientation properties. When observed under a polarizing microscope with crossed Nicols, the cell alternated a dark field and a light field for every angle of rotation of 45°.

A change in transmission caused by ultraviolet irradiation was measured under crossed Nicols in the same manner as in Example 4. As a result, there was observed a change reaching about 4% at its maximum in transmission in the wavelength region of from 700 nm to 830 nm which does not concern absorption of the spiro-oxazine compound. The response time was 650 ms at the time of erasion, though longer than that in Example 3.

EXAMPLE 8

A polymerizable fulgide compound of formula (E) (0.1 g) and 1.9 g of a liquid crystal monomer of formula (F) were copolymerized in THF in the presence of AIBN. The reaction mixture was re-precipitated in methanol to obtain 1.7 g of a high polymeric liquid crystal as an ocherous solid. The composition of the high polymeric liquid crystal was confirmed by an NMR analysis to be substantially equal to that charged. The resulting high polymeric liquid crystal had a weight average molecular weight of about 6,000 and exhibited a liquid crystal phase in a temperature range of from 17° to 96.5° C.

A liquid crystal cell was prepared by using the resulting high polymeric liquid crystal in the same manner as in Example 4. The cell, after contact bonding, was subjected to annealing at 90° C. for 30 minutes to cause uniaxial orientation. The cell was transparent and assumed a satisfactory orientation state. When observed under a polarizing microscope with crossed Nicols, the cell alternated a dark field and a light field for every angle of rotation of 45°.

Figure 10:
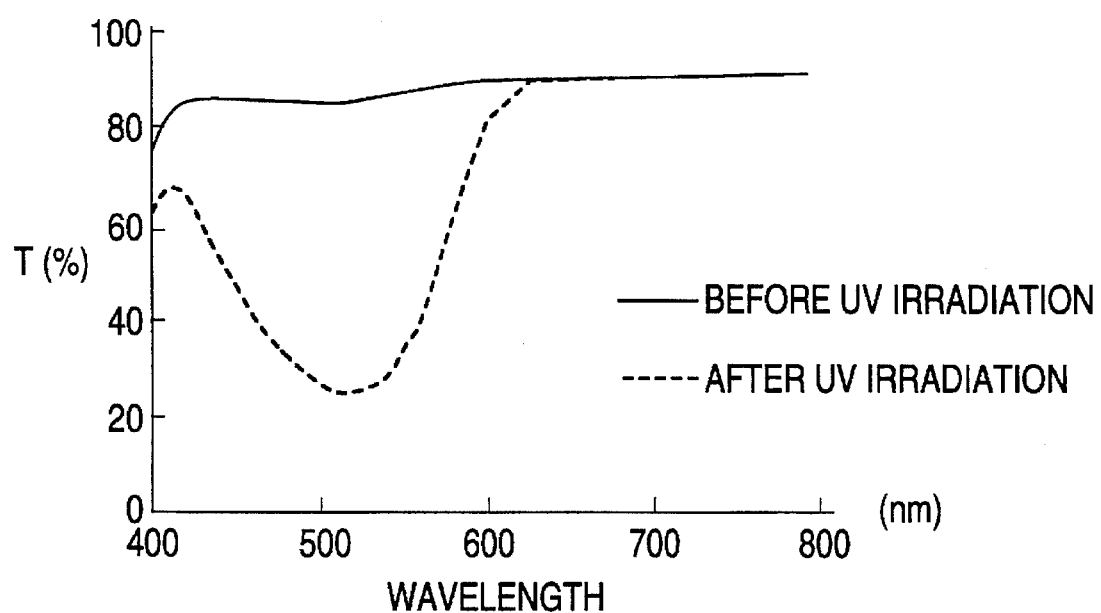
FIG. 10 is a spectrum of light transmitted by the light modulation device prepared in Example 8 before or after ultraviolet irradiation.

The cell exhibited photochromism on ultraviolet irradiation. The change in transmission spectrum is shown in FIG. 10. After ultraviolet irradiation, the maximum absorption appeared at $\lambda$=520 nm with the absorption end at 630 nm. The change in transmission under crossed Nicols reached about 15% at its maximum in the wavelength region of from 630 nm to 830 nm which does not concern absorption of the fulgide compound. This change was reversible and was erasable (initializable), not on irradiation of light for reading ($\lambda_C$=780 nm), but on white light irradiation.

EXAMPLE 9

A polymer comprising a monomer unit represented by formula (H) shown below was used as a side chain type high polymeric liquid crystal. The high polymeric liquid crystal used here had a weight average molecular weight of about 6,000 and showed a liquid crystal phase at a temperature ranging from 12.5° to 98° C.

A 8% PVA aqueous solution was coated on each of two glass substrates by spin coating, and the coated film was rubbed with cotton cloth. A 40% THF solution of the above-prepared high polymeric liquid crystal containing 3% of a fulgide compound represented by formula (B) was coated on one of the glass substrates by bar coating. After drying the coated film, a resin spacer having a diameter of 10 μm was scattered thereon, and the other glass substrate was superposed thereon and contact bonded at a temperature elevated up to 130° C. The cell was then subjected to annealing at 90° C. for 30 minutes to cause uniaxial orientation of the high polymeric liquid crystal. The cell was transparent and exhibited satisfactory orientation properties. When observed under a polarizing microscope with crossed Nicols, the cell alternatived a dark field and a light field for every angle of rotation of 45°.

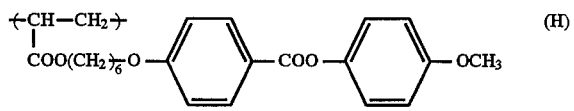

Figure 11:
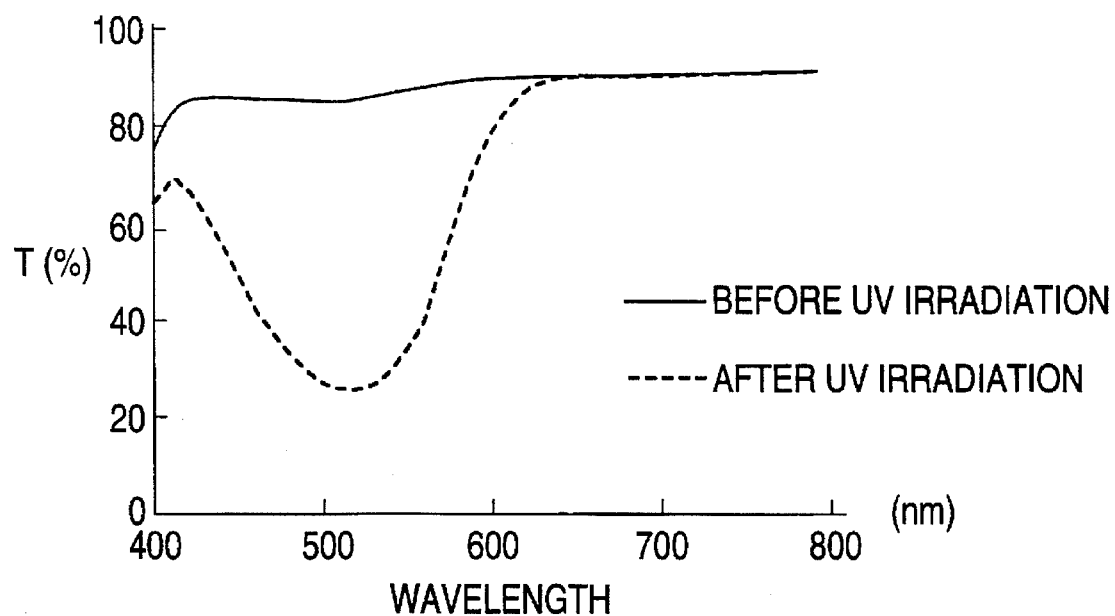
FIG. 11 is a spectrum of light transmitted by the light modulation device prepared in Example 9 before or after ultraviolet irradiation.

The cell exhibited photochromism on ultraviolet irradiation. FIG. 11 shows the transmission spectrum before and after ultraviolet irradiation. After the ultraviolet irradiation (λ=365 nm), the maximum absorption appeared at λ=510 nm with an absorption end at 620 nm.

Figure 12:
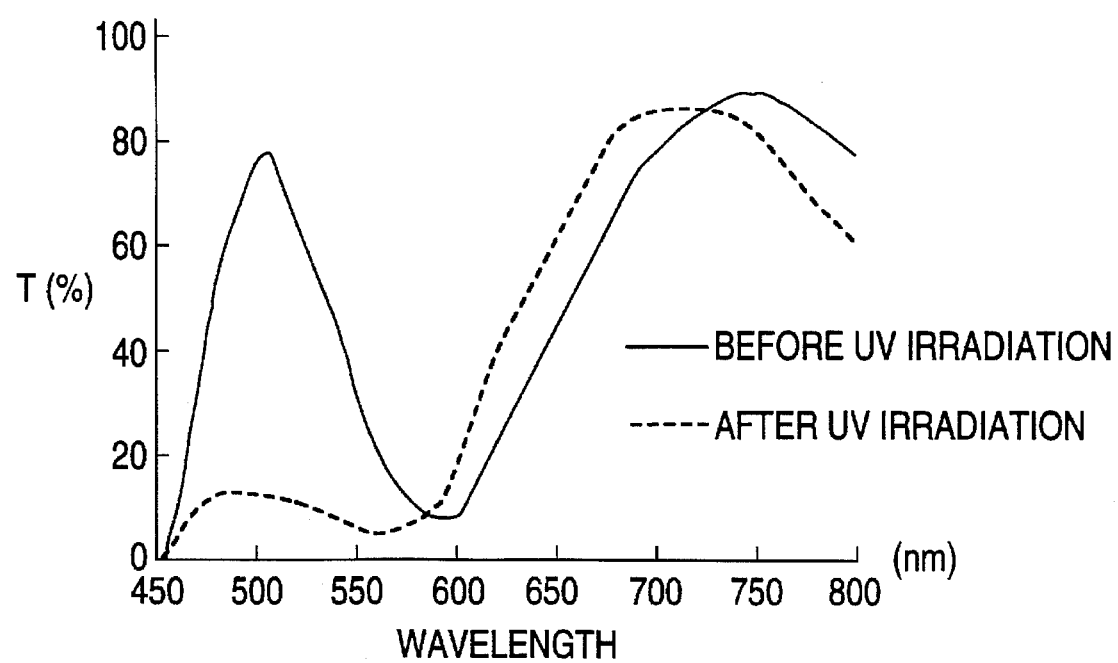
FIG. 12 is a spectrum of light transmitted by the light modulation device prepared in Example 9 under crossed Nicols, with the direction of orientation forming an angle of 45° with the plane of polarization, before or after ultraviolet irradiation.

The cell was placed between a pair of polarizing sheets (crossed Nicols) with the direction of orientation forming an angle of 45° with the plane of polarization, and light was vertically irradiated onto the cell. A change in transmission spectrum caused by ultraviolet irradiation was measured at 25° C. The results obtained are shown in FIG. 12. There was observed a change reaching about 10% at its maximum in transmission in the wavelength region of from 620 nm to 830 nm which does not concern absorption of the fulgide compound. This change was reversible and was erased (initialized), not on irradiation of light for reading ($\lambda_c$=780 nm), but on white light irradiation.

EXAMPLE 10

A polymer comprising a monomer unit represented by formula (A), having a weight average molecular weight of about 20,000, and exhibiting a liquid crystal phase in a temperature range of from 35° to 122° C. was used as a side chain type high polymeric liquid crystal. A fulgide imide derivative having a p-n-octylphenylene group and represented by formula (I) shown below was synthesized and used as a photochromic compound.

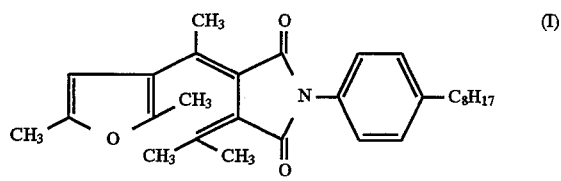

A pair of glass substrates on each of which a polyimide orientation film was formed and rubbed were prepared. A 40% THF solution of the high polymeric liquid crystal containing 1, 3, 5, or 7% of the photochromic compound was coated on one of the glass substrates by bar coating. After drying the coated film, a resin spacer having a diameter of 10 μm was scattered thereon, and the other glass substrate was superposed thereon and contact bonded at a temperature elevated up to 140° C. The cell was then gradually cooled from 120° C. to room temperature at a cooling rate of 2° C./min to cause uniaxial orientation of the high polymeric liquid crystal. The cell was transparent and exhibited satisfactory orientation properties as observed under a polarizing microscope.

Figure 13:
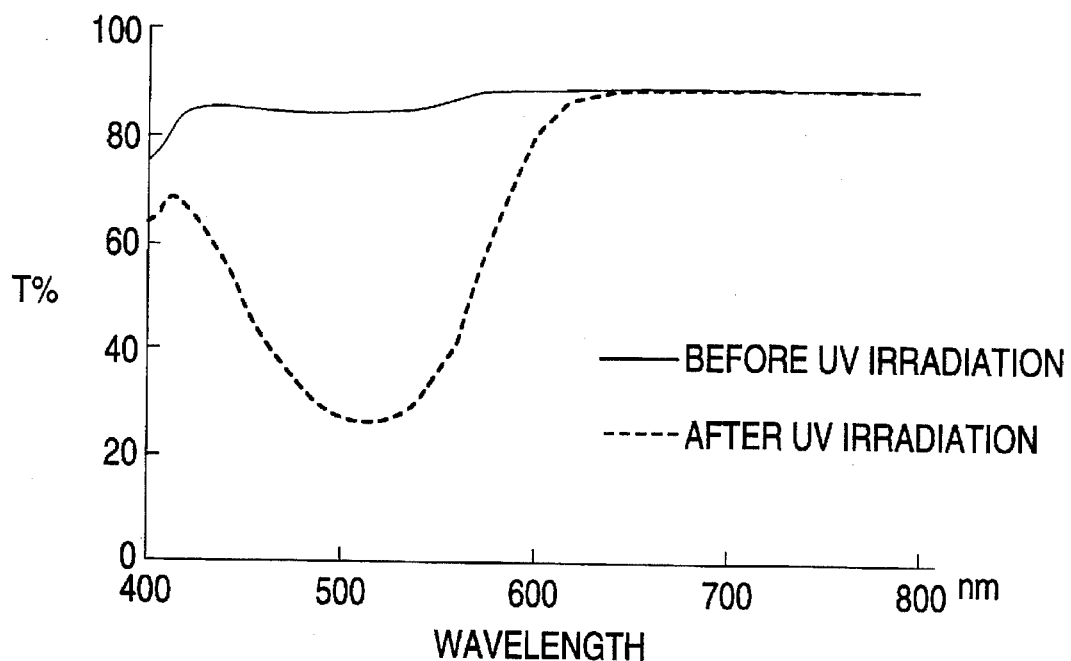
FIG. 13 is a spectrum of light transmitted by the light modulation device prepared in Example 10 before or after ultraviolet irradiation.

Immediately on irradiation with ultraviolet light (λ=365 nm), the cell turned to red. This change in absorption is shown in FIG. 13. As is shown, the maximum absorption appeared at λ=520 nm with an absorption end at 620 nm after the ultraviolet irradiation.

Figure 14:
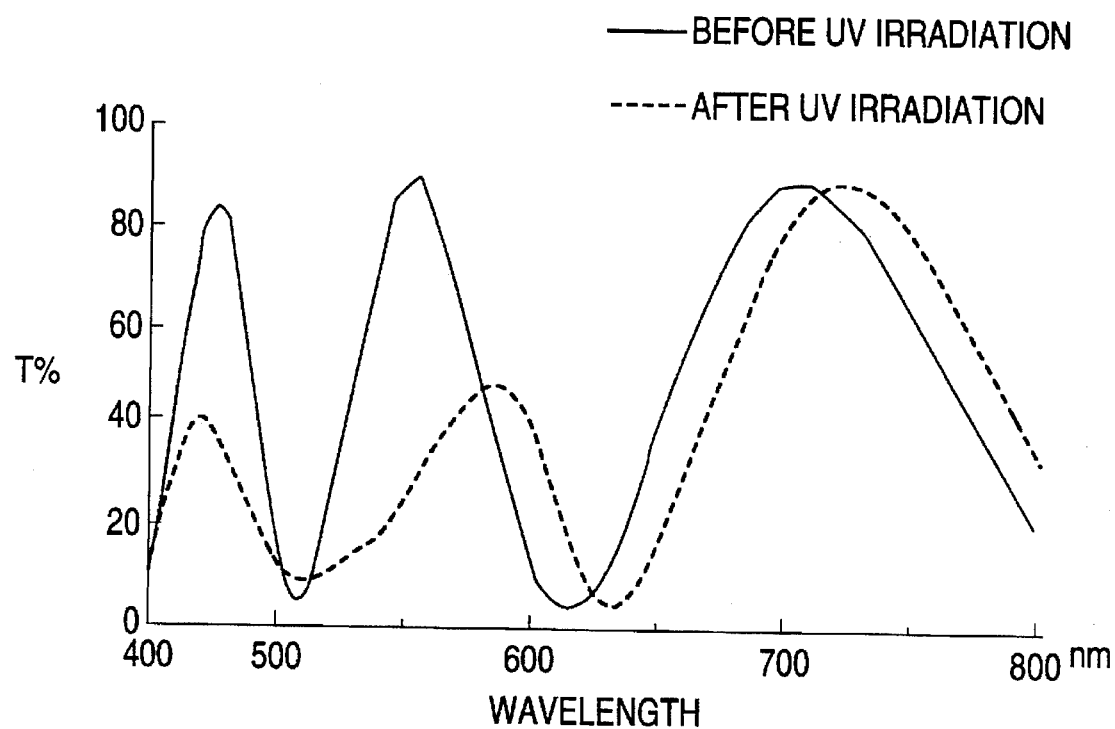
FIG. 14 is a spectrum of light transmitted by the light modulation device prepared in Example 10 under crossed Nicols, with the direction of orientation forming an angle of 45° with the plane of polarization, before or after ultraviolet irradiation.

The cell was placed between a pair of polarizing sheets (crossed Nicols) with the direction of orientation forming an angle of 45° with the plane of polarization, and light was vertically irradiated onto the cell. A change in transmission spectrum caused by ultraviolet irradiation was measured at 25° C. The results obtained in one case are shown in FIG. 14. It was confirmed that ultraviolet irradiation results in a change in transmission accompanied by a change in absorption wavelength of the photochromic compound and, at the same time, a great change in the wavelength region of from 620 to 820 nm which does not concern with the absorption of the photochromic compound. The relationship between the content of the photochromic compound and the maximum change in transmission ($\Delta T_{max}$) is shown in Table 1 below.

TABLE 1

| Content of Photochromic Compound (wt %) | $\Delta T_{max}$ (%) | λ (nm) |
|---|---|---|
| 1 | 8 | 660 |
| 3 | 13 | 660 |
| 5 | 15 | 640 |
| 7 | 21 | 640 |

As is apparent from Table 1, according as the content of the photochromic compound increases, the rate of change tends to increase, reaching 21% at its maximum.

These changes were reversibly and repeatedly obtained by alternating irradiation of ultraviolet light and visible light with no deterioration such as a reduction in the rate of change.

EXAMPLE 11

A polymer comprising a monomer unit of formula (H) was used as a side chain type high polymeric liquid crystal. The high polymeric liquid crystal used here had a weight average molecular weight of about 6,000 and showed a liquid crystal phase at a temperature ranging from 12.5° to 98° C.

A uniaxially orientated liquid crystal cell was prepared in the same manner as in Example 10, except for using the above high polymeric liquid crystal and using the same photochromic compound as used in Example 10 in an amount of 1, 3, or 5%.

The cell turned to red on ultraviolet irradiation to show the maximum absorption at λ=520 nm with an absorption end at 620 nm after ultraviolet irradiation. The relationship between the content of the photochromic compound and the maximum change in transmission ($\Delta T_{max}$) is shown in Table 2 below.

TABLE 2

| Content of Photochromic Compound (wt %) | $\Delta T_{max}$ (%) | λ (nm) |
|---|---|---|
| 1 | 4 | 760 |
| 3 | 8 | 770 |
| 5 | 10 | 760 |

As is apparent from Table 2, according as the content of the photochromic compound increases, the rate of change tends to increase, reaching 10% at its maximum.

These changes were reversibly and repeatedly obtained by alternating irradiation of ultraviolet light and visible light with no deterioration such as a reduction in the rate of change.

EXAMPLE 12

A uniaxially orientated liquid crystal cell was prepared in the same manner as in Example 10, except for using a high polymeric liquid crystal comprising a monomer unit of formula (A), having a weight average molecular weight of about 5500, and exhibiting a liquid crystal phase at a temperature ranging from 27° to 106° C. and a fulgide derivative having a bulky substituent and represented by formula (J) shown below (1, 3, or 5%).

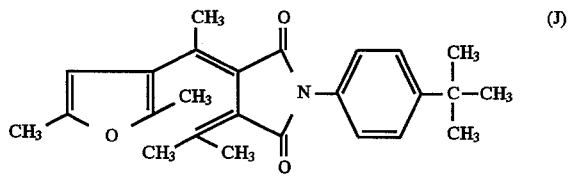

The cell turned to red on ultraviolet irradiation to show the maximum absorption at λ=520 nm with an absorption end at 620 nm after ultraviolet irradiation. The relationship between the content of the photochromic compound and the maximum change in transmission ($\Delta T_{max}$) is shown in Table 3 below.

TABLE 3

| Content of Photochromic Compound (wt %) | $\Delta T_{max}$ (%) | λ (nm) |
|---|---|---|
| 1 | 5 | 680 |
| 3 | 12 | 650 |
| 5 | 24 | 630 |

As is apparent from Table 3, according as the content of the photochromic compound increases, the rate of change tends to increase, reaching 24% at its maximum.

These changes were reversibly and repeatedly obtained by alternating irradiation of ultraviolet light and visible light with no deterioration such as a reduction in the rate of change.

As described and demonstrated above, the light modulation device according to the present invention achieves light modulation by using only light and can be applied as an optical computing device, an optical memory, etc.

The memory material using the light modulation device of the present invention is excellent in non-destructive reading performance, durability on repeated use, and thermal stability of memory. The reading method according to the present invention using the optical memory material makes it feasible to achieve high-density recording on a photon mode while realizing non-destructive reading which had been long desired. Accordingly, the optical memory material and the reading method of the present invention are useful in optical discs, optical memory cards, etc.

While the invention has been described in detail and with reference to specific examples thereof, it will be apparent to one skilled in the art that various changes and modifications can be made therein without departing from the spirit and scope thereof.

What is claimed is:

1. A light modulation device composed of a high polymeric liquid crystal film comprising a uniaxially oriented side chain type high polymeric liquid crystal containing a photochromic compound and a supporting member for supporting said high polymeric liquid crystal film, wherein said photochromic compound comprises a spiropyran derivative, a spiro-oxazine derivative or a diarylethene derivative, and wherein said high polymeric liquid crystal film exhibits a nematic phase in a temperature of use that is room temperature.

2. A light modulation device composed of a high polymeric liquid crystal film comprising a uniaxially oriented side chain type high polymeric liquid crystal containing a photochromic compound and a supporting member for supporting said high polymeric liquid crystal film, wherein said photochromic compound comprises a spiropyran derivative, a spiro-oxazine derivative or a diarylethene derivative, and wherein said device further comprises a polarizer.

3. A light modulation device composed of a high polymeric liquid crystal film comprising a uniaxially oriented side chain type high polymeric liquid crystal containing a photochromic compound and a supporting member for supporting said high polymeric liquid crystal film, wherein said photochromic compound comprises a spiropyran derivative, a spiro-oxazine derivative or a diarylethene derivative, and wherein said side chain type high polymeric liquid crystal containing a photochromic compound is a side chain type high polymeric liquid crystal having a photochromic component covalently bonded thereto.

4. A light modulation device composed of a high polymeric liquid crystal film comprising an uniaxially oriented side chain type high polymeric liquid crystal containing a photochromic compound and a supporting member for supporting said high polymeric liquid crystal film, wherein said photochromic compound is a compound represented by formula (XXVII) or (XXVIII):

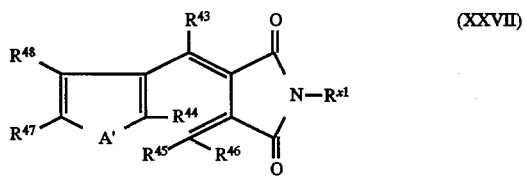

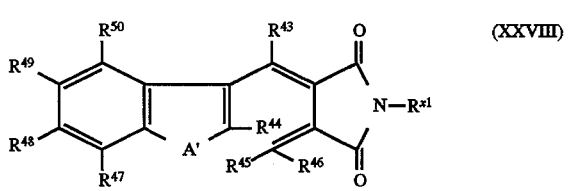

wherein $R^{43}$, $R^{44}$, $R^{45}$, $R^{46}$, $R^{47}$, $R^{48}$, $R^{49}$, and $R^{50}$, which may be the same or different, each represent a hydrogen atom, a halogen atom, or an alkyl group having from 1 to 10 carbon atoms; A' represents an oxygen atom, a sulfur atom, or —NR$^{x2}$ (wherein R$^{x2}$ represents a hydrogen atom, an alkyl group having from 1 to 10 carbon atoms, or a substituted or unsubstituted phenyl group); and R$^{x1}$ represents an alkyl group having from 2 to 30 carbon atoms, or a group of formula (XXIX) or (XXX):

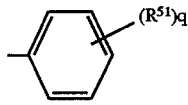 (XXVII)

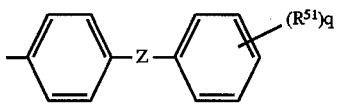 (XXVIII)

wherein Z represents a single bond, —O—, —COO—, —OCO—, —CH$_2$O—, —N=N—, —CH=N—, or —N—CH—; R$^{51}$ represents an alkyl group having from 1 to 30 carbon atoms, an alkoxy group, a halogen atom, or a cyano group; and q represents an integer of from 1 to 5.

5. A method for light modulation of a high polymeric liquid crystal film comprising a uniaxially oriented side chain type high polymeric liquid crystal containing a photochromic compound and a supporting member for supporting said film, wherein said photochromic compound is a thermally stable material reversibly photoisomerizable due to reversible structural change upon irradiation of light depending upon the wavelength of said light and said uniaxially oriented side chain type high polymeric liquid crystal shows a refractive index anisotropy with respect to a polarized light due to the reversible structural change, comprising photoisomerizing said photochromic compound to induce a change in refractive index anisotropy of said high polymeric liquid crystal film and detecting said change with light in the wavelength region in which said photochromic compound has no absorption.

6. A method according to claim 5, wherein photoisomerizing said photochromic compound also induces a reversible change in birefringence of said high polymeric liquid crystal film.

7. A light modulation device composed of a high polymeric liquid crystal film comprising a uniaxially oriented side chain type high polymeric liquid crystal containing a photochromic compound and a supporting member for supporting said high polymeric liquid crystal film, wherein said photochromic compound is a thermally stable material reversibly photoisomerizable due to reversible structural change upon irradiation of light depending upon the wavelength of said light and said uniaxially oriented side chain type high polymeric liquid crystal shows a refractive index anisotropy with respect to a polarized light due to the reversible structural change.

8. A light modulation device according to claim 7, wherein said high polymeric liquid crystal film further shows a change in birefringence with said reversible structural change of said photochromic compound.

9. A light modulation device according to claim 8, wherein said photochromic compound comprises a spiropyran derivative, a spiro-oxazine derivative or a diarylethene derivative.

10. A light modulation device according to claim 7, wherein said photochromic compound comprises a spiropyran derivative, a spiro-oxazine derivative or a diarylethene derivative.

11. A light modulation device composed of a high polymeric liquid crystal film comprising a uniaxially oriented side chain type high polymeric liquid crystal containing a photochromic compound and a supporting member for supporting said high polymeric liquid crystal film, wherein said photochromic compound comprises a spiropyran derivative, a spiro-oxazine derivative or a diarylethene derivative, and wherein said high polymeric liquid crystal film exhibits birefringence.

* * * * *